US011733102B2

(12) United States Patent
Tanaka

(10) Patent No.: US 11,733,102 B2
(45) Date of Patent: Aug. 22, 2023

(54) BOLOMETER-TYPE DETECTOR AND METHOD FOR MANUFACTURING THE SAME

(71) Applicant: NEC Corporation, Tokyo (JP)

(72) Inventor: Tomo Tanaka, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 17/713,483

(22) Filed: Apr. 5, 2022

(65) Prior Publication Data

US 2022/0333994 A1    Oct. 20, 2022

(30) Foreign Application Priority Data

Apr. 8, 2021  (JP) ................................ 2021-066018

(51) Int. Cl.
*G01J 5/08* (2022.01)
*G01J 5/22* (2006.01)
*G01J 5/20* (2006.01)

(52) U.S. Cl.
CPC ............. *G01J 5/0853* (2013.01); *G01J 5/22* (2013.01); *G01J 2005/202* (2013.01)

(58) Field of Classification Search
CPC ...... G01J 5/0853; G01J 5/22; G01J 2005/202; G01J 5/046; G01J 5/20; B82Y 20/00; H01L 27/14669
See application file for complete search history.

(56) References Cited

U.S. PATENT DOCUMENTS

| | | | | |
|---|---|---|---|---|
| 8,796,630 B2* | 8/2014 | Tohyama | ................. | G01J 5/12 |
| | | | | 250/349 |
| 2011/0108729 A1* | 5/2011 | Oda | ................. | H01L 27/14649 |
| | | | | 257/E21.04 |
| 2011/0140224 A1* | 6/2011 | Kropelnicki | ........ | H01L 21/2007 |
| | | | | 257/E31.093 |
| 2013/0002394 A1* | 1/2013 | Narita | ....................... | G01J 5/20 |
| | | | | 29/610.1 |
| 2018/0266945 A1* | 9/2018 | Kitaura | .................... | H01Q 1/24 |
| 2019/0032114 A1* | 1/2019 | Trivedi | ................. | B01L 3/5027 |
| 2020/0407219 A1* | 12/2020 | Hong | ........................ | G01J 5/20 |
| 2022/0034720 A1* | 2/2022 | Tanaka | .................. | G01J 5/0853 |
| 2022/0034721 A1* | 2/2022 | Tanaka | .................... | G01J 5/046 |

FOREIGN PATENT DOCUMENTS

JP    2007-263769 A    10/2007
WO    2011/145295 A1    11/2011

* cited by examiner

*Primary Examiner* — David P Porta
*Assistant Examiner* — Gisselle M Gutierrez
(74) *Attorney, Agent, or Firm* — Sughrue Mion, PLLC

(57) ABSTRACT

An example object of the present invention is to provide a bolometer-type detector capable of reducing heat transfer between pixels. A bolometer-type detector according to an example aspect of the present invention includes a plurality of pixels, and at least includes: a substrate, a heat insulating layer provided on the substrate, bolometer films provided on individual pixels on the heat insulating layer, and a wiring for signal output connected to contact electrodes provided in contact with the bolometer films, wherein the wiring for signal output is disposed in a layer different from the bolometer films, and the heat insulating layer between adjacent pixels is removed at least partially in the depth direction and in a region of a length of 50% or longer and a width of 100 nm or wider of a closed curve that surrounds each bolometer film.

10 Claims, 17 Drawing Sheets

11. Division of pixels by etching

13. Formation of wirings to connect contact electrodes and vertical/horizontal wirings

BOLOMETER-TYPE DETECTOR AND METHOD FOR MANUFACTURING THE SAME

This application is based upon and claims the benefit of priority from Japanese patent application No. 2021-066018, filed on Apr. 8, 2021, the disclosure of which is incorporated herein in its entirety by reference.

TECHNICAL FIELD

The present invention relates to a bolometer-type detector and a method for manufacturing the same.

BACKGROUND ART

Infrared sensors have a very wide range of applications such as not only monitoring cameras for security, but also thermography for human body, in-vehicle cameras, and inspection of structures, foods, and the like, and are thus actively used in industrial applications in recent years. In particular, development of a low-cost and high-performance infrared sensor capable of obtaining biological information in cooperation with IoT (Internet of Thing) is expected.

As an infrared sensor, a bolometer-type uncooled infrared sensors using a titanium film or vanadium oxide as a resistor material are known (Patent Literature 1). The bolometer described in Patent Literature 1 has a diaphragm-type heat-insulating unit 4 on a silicon substrate 1, which is separated from the silicon substrate 1 by a gap 7 with a leg 42 as a support, and has an infrared detection part 3 on the heat-insulating unit 4 (FIGS. 15). When irradiated with infrared rays, the infrared detection part 3 is heated and detects the resistance change caused by temperature change. The gap 7 is kept in vacuum to prevent heat being transferred to the silicon substrate 1 by heat conduction through air.

Bolometers having such a diaphragm structure require a complicated manufacturing process, and furthermore, the sensor needs to be accommodated in a vacuum-sealed package, resulting in an unavoidable problem of a high cost.

To address the problem described above, a printed-type bolometer has been proposed (Patent Literature 2). The bolometer described in Patent Literature 2 has a structure in which a heat insulating layer is provided between a bolometer part (thermistor resistor) and a substrate in place of the gap described above to prevent heat conduction from the bolometer part to the substrate. Specifically, a heat insulating layer 711 is provided on a substrate 710, a light reflection film and a light transmitting layer 713 are provided thereon, and a first electrode 702, a second electrode 703, and a thermistor resistor 701 connected to the two electrodes are provided further thereon, as shown in FIG. 16. The first electrode 702 is connected to a column wiring 704, and the second electrode 703 is connected to a row wiring 705, respectively, and the column wiring 704 and the row wiring 705 are electrically insulated from each other by insulating films 706. Employing the structure described above provides an advantage of capable of forming a bolometer array with no formation of contacts.

In the bolometer described in Patent Literature 2, parylene is used as the heat insulating layer 711. Parylene excels in high thermal insulation in the stacking direction but the thermal insulation in the horizontal direction is low, and thus has a problem in that heat is likely to flow into adjacent pixels via the parylene surface, and the heat flowing into adjacent pixels cannot be sufficiently suppressed. Furthermore, the inter-pixel heat flow (heat inflow between pixels) is more likely to occur particularly when the column wiring 704 and the row wiring 705, which are made of metal having high thermal conductivity, are disposed between bolometer films, as shown in FIG. 16. The inter-pixel heat flow causes a problem of an unclear image due to the heat transmitted between adjacent pixels when the pixels are integrated in an array. There is therefore still a need for a bolometer-type detector in which the heat flow between pixels is reduced.

CITATION LIST

Patent Literature

Patent Literature 1: Japanese Patent Laid-Open No. 2007-263769
Patent Literature 2: International publication No. 2011/145295

SUMMARY OF INVENTION

Technical Problem

The present invention is made in view of the above problem, and an object thereof is to provide a bolometer-type detector in which the heat inflow between pixels is reduced, and a method for manufacturing the same.

Solution to Problem

One aspect of the present invention is directed to a bolometer-type detector comprising a plurality of pixels, the bolometer-type detector at least comprising
  a substrate,
  a heat insulating layer provided on the substrate,
  bolometer films provided on individual pixels on the heat insulating layer, and
  a wiring for signal output connected to contact electrodes provided in contact with the bolometer films,
  wherein the wiring for signal output is disposed in a layer different from the bolometer films, and
  the heat insulating layer between adjacent pixels is removed at least partially in the depth direction and in a region of a length of 50% or longer and a width of 100 nm or wider of a closed curve that surrounds each bolometer film.

Another aspect of the present invention is directed to a method for manufacturing a bolometer-type detector comprising a plurality of pixels, the method comprising
  forming a first heat insulating layer on a substrate,
  forming one kind of wiring for signal output on the first heat insulating layer,
  forming a second heat insulating layer on the first heat insulating layer on which the wiring for signal output has been formed,
  forming the other kind of wiring for signal output on the second heat insulating layer,
  forming a third heat insulating layer on the second heat insulating layer on which the wiring for signal output has been formed,
  forming bolometer films on the third heat insulating layer,
  forming contact electrodes on the bolometer films,
  optionally forming a protective layer on the bolometer films on which the contact electrodes have been formed,
  removing the heat insulating layer between adjacent pixels at least partially in the depth direction and in a region of a length of 50% or longer and a width of 100 nm or wider of a closed curve that surrounds each bolometer film, and connecting the contact electrodes to each of the wirings for signal output.

Advantageous Effect of Invention

According to the present invention, a bolometer-type detector in which heat inflow between pixels is reduced.

DESCRIPTION OF EMBODIMENTS

A bolometer-type detector according to the present invention is characterized in that the heat inflow between adjacent pixels can be reduced by removing at least part of the heat insulating layer between the pixels. In addition, the inter-pixel heat inflow can be further reduced by providing a wiring layer having high thermal conductivity in a layer different from the bolometer film.

In an embodiment, the wiring layer having high thermal conductivity is provided in a layer different from the bolometer film, which eliminates the need for increasing the distance between pixels, whereby a higher fill factor can be achieved.

According to the method for manufacturing the bolometer-type detector of the present invention, reduction in the inter-pixel heat inflow can be achieved by a simple process of removing at least part of the heat insulating layer, especially in a printed-type bolometer detector.

Furthermore, in an embodiment, when etching away the heat insulating layer, the wiring layer disposed in a layer different from the bolometer film can be used as an etching stop layer, whereby a bolometer detector in which the heat insulating layer is divided into individual pixels can be manufactured in a simple process.

An example of a bolometer-type detector and a method for manufacturing the same according to the present embodiment will be described with reference to the drawings.

In FIGS. 2 to 11, the figure at the center is a top view, the figure on the right is a cross-sectional view taken along the line y1-y1', y2-y2', or y3-y3', and the figure at the bottom is a cross-sectional view taken along the line x1-x1' or x2-x2'. In FIG. 1 and FIGS. 12 to 14, the figure at the center is a top view, the figure on the right is a right side view cut along the line y1-y1', y2-y2', or y3-y3', and the figure at the bottom is a front view cut along the line x2-x2'.

FIGS. 1 to 14 show an example in which a parylene layer, a carbon nanotube film, and a SiN layer are used as a heat insulating layer, a bolometer film, and a protective layer, respectively, and the heat insulating layer is removed to the depth of a vertical wiring or a horizontal wiring or a substrate, but the bolometer-type detector and a method for manufacturing the same according to the present invention are not necessarily limited to the configuration described above.

Figure 1:
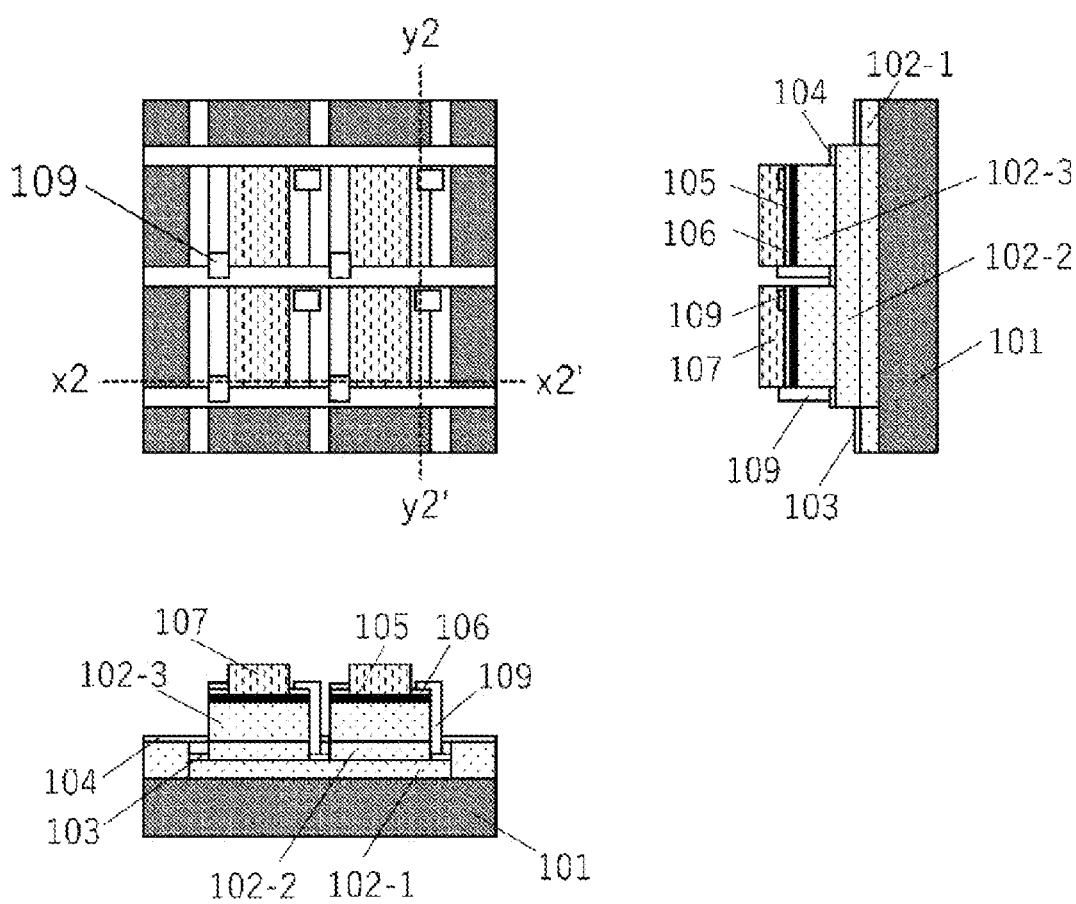
FIG. 1 is a schematic view of an example of the structure of one embodiment of the bolometer of the present invention (center: top view, right: right side view cut along the line y2-y2', bottom: front view at x2-x2' position.

FIG. 1 schematically shows a bolometer-type detector according to an embodiment. The bolometer-type detector according to the present embodiment comprises a first heat insulating layer (parylene first layer) 102-1 provided on a substrate 101, a wiring for signal output (vertical wiring)

103 provided on the first heat insulating layer 102-1, a second heat insulating layer (parylene second layer) 102-2 provided on the first heat insulating layer 102-1, on which the wiring for signal output 103 is provided, a wiring for signal output (horizontal wiring) 104 provided on the second heat insulating layer 102-2, a third heat insulating layer (parylene third layer) 102-3 provided on the second heat insulating layer 102-2, on which the wiring for signal output 104 is provided, bolometer films (carbon nanotube film) 105 provided on individual pixels on the third heat insulating layer 102-3, a pair of contact electrodes 106 connected to the bolometer films 105, and a protective film 107 (SiN film) provided on the bolometer films 105. The contact electrodes 106 are connected to the wiring for signal output (vertical wiring 103 and horizontal wiring 104) via connection electrodes 109.

In the bolometer-type detector shown in FIG. 1, the inter-pixel heat insulating layer (the insulating layer between adjacent bolometer films) i removed to the depth of the wiring for signal output (vertical wiring 103 and horizontal wiring 104).

As described above, the bolometer-type detector according to the present embodiment is characterized in that at least part of the inter-pixel heat insulating layers is removed.

Heat insulating layers 102 (heat insulating layers 102-1, 102-2, and 102-3 are collectively referred to herein as "heat insulating layers 102" in some cases) may be so configured that at least part of the region of the inter-pixel heat insulating layer is removed. It is preferable in the top view of each pixel that the heat insulating layer is removed in a region of at least 50%, for example, 60% or greater, preferably 70% or greater, more preferably 80% or greater, still more preferably 90% or greater (may be 100%) of the length of the closed curve that surrounds a bolometer film region (a region of a bolometer film 105, contact electrodes 106, and connection electrodes 109).

The width removed at each point of the closed curve is at least 100 nm, preferably 500 nm or greater, more preferably 1 μm or greater. In an embodiment, it is preferable that the heat insulating layer is removed over the width of the inter-pixel heat insulating layer (that is, from the edge of a bolometer film region to the edge of a bolometer film region of adjacent pixel).

In an embodiment, it is preferable that the heat insulating layer is removed over the width of the inter-pixel heat insulating layer over a length of 80% of the closed curve or longer. In an embodiment, it is preferable that the inter-pixel heat insulating layer is removed at all pixels over the width of the heat insulating layer over the entire closed curve length (100%) (that is, inter-pixel heat insulating layer is removed over entire region at all pixels), so that the heat insulating layer is completely divided into individual pixels, as shown in FIG. 1.

The closed curve that surrounds a bolometer film region may be disposed at any position between two adjacent bolometer film regions. The closed curve may have an indefinite shape, that is, may be a straight line or an arbitrary curve at each point, but the length (%) of the unremoved region is expressed by the length of the shortest line that connects the two ends of the unremoved region. The width of the removed region at each point of the closed curve is the width in the direction perpendicular to the line tangent to the closed curve at the point. It is also preferable that the closed curves of two adjacent pixels coincide with each other in the region of the heat insulating layer between the two pixels.

In the structure shown in FIG. 1, there is a heat insulating layer along the four sides around each bolometer film region, and from the viewpoint of uniform reduction in heat transfer, it is preferable that at least part of the heat insulating layer is removed at least along two sides, preferably three sides or more, more preferably all four sides.

The pixels disposed at the outer circumference of the bolometer array have no adjacent pixels on the outer sides. It is, however, preferable that at least part of the heat insulating layers along a side where no adjacent pixels are present is also removed, as along a side where adjacent pixels are present, that is, it is preferable that the outermost pixels are also thermally separated from each other in a similar manner as the other pixels are. The pixels are thus equally insulated from the heat from the substrate, whereby the reaction speed at the pixels can be more uniform.

In the region where the heat insulating layers 102 are removed, the heat inflow via the surface of the heat insulating layer can be reduced as long as at least part of the heat insulating layer is removed from the surface thereof (upper surface of third parylene layer in FIG. 1) in the depth direction, but it is preferable that the depth to which the heat insulating layer is removed is, for example, at least 100 nm, preferably at least 1 μm, more preferably at least 10 μm, still more preferably at least 20 μm from the surface of the heat insulating layer.

In an embodiment, the heat insulating layer is removed to the depth of signal extraction wiring (wiring for signal output), whereby the inter-pixel heat transfer can be further reduced.

An example of a method for manufacturing the bolometer-type detector described above will be schematically described step by step with reference to the drawings.

Figure 2:
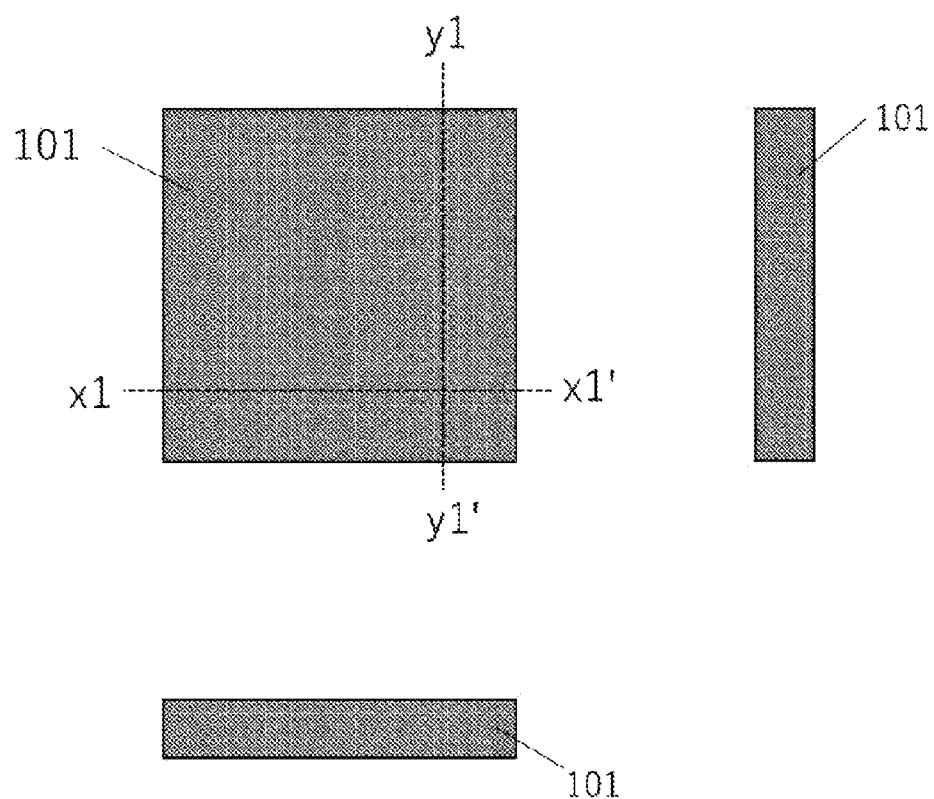
FIG. 2 shows a step of the method of manufacturing a bolometer according to one embodiment of the present invention (center: top view, right: cross-sectional view at y1-y1' position, bottom: cross-sectional view at x1-x1' position.

Step 1: Substrate (FIG. 2)

First, a substrate 101 is prepared.

The substrate 101 may be either a flexible substrate or a rigid substrate, and may be appropriately selected, and those in which at least the element forming surface has insulating property or semiconducting property are preferred. For examples, inorganic materials such as Si, $SiO_2$-coated Si, $SiO_2$, SiN, glass and the like, and organic materials such as polymers, resins, plastics, for examples, parylene, polyimide, polyethylene, polypropylene, polystyrene, polyvinyl chloride, polyethylene terephthalate, acrylonitrile styrene resin, acrylonitrile butadiene styrene resin, fluororesin, methacrylic resin, polycarbonate and the like, but is not limited thereto.

Figure 3:
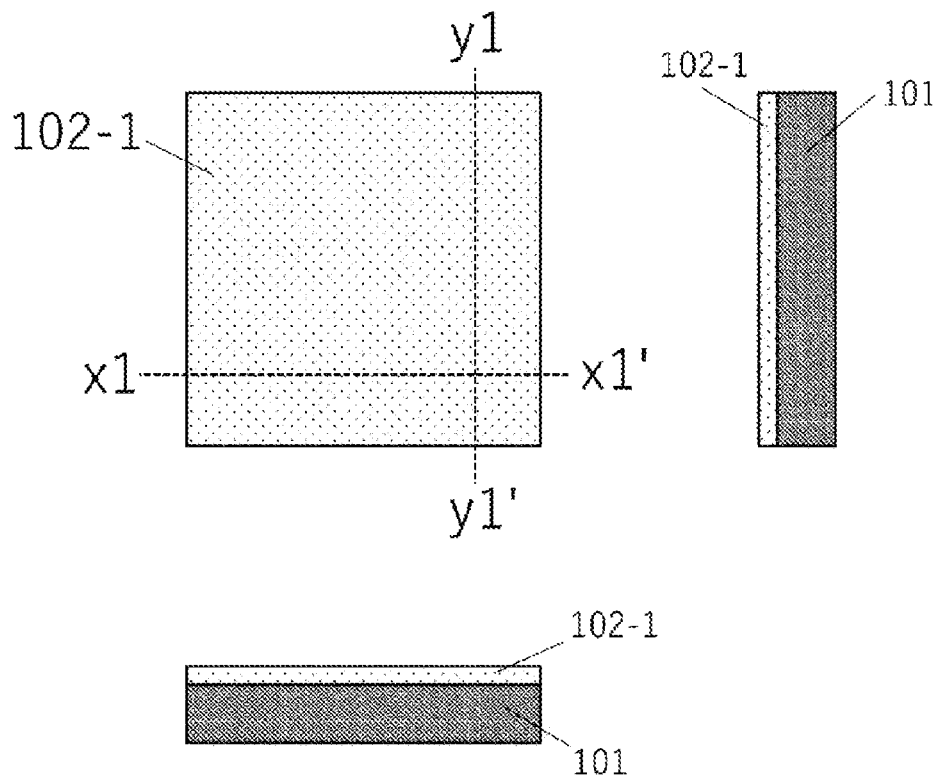
FIG. 3 shows a step of the method of manufacturing a bolometer according to one embodiment of the present invention (center: top view, right: cross-sectional view at y1-y1' position, bottom: cross-sectional view at x1-x1' position.

Step 2: Formation of First Heat Insulating Layer (FIG. 3)

The first insulating layer 102-1 is then formed on the substrate 101.

Figure 15A:
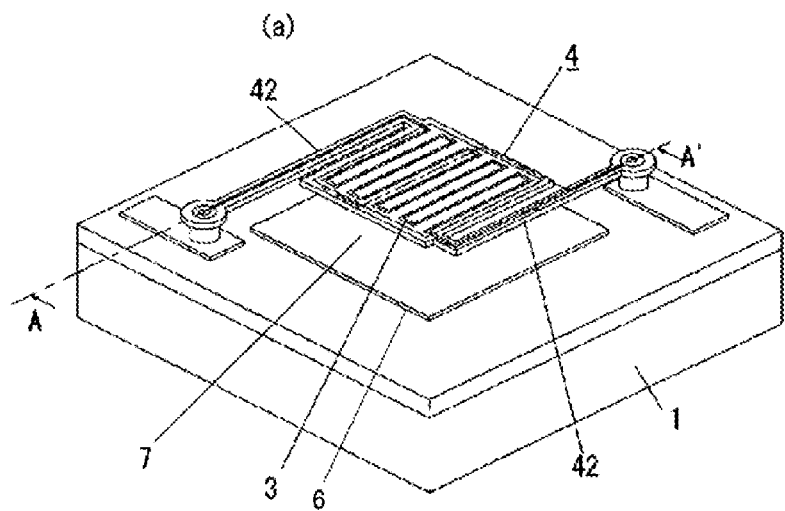
FIGS. 15A and B show the structure of the bolometer of a related art (Patent Literature 1). (a) is an oblique view and (b) is a longitudinal front view.
Figure 15B:
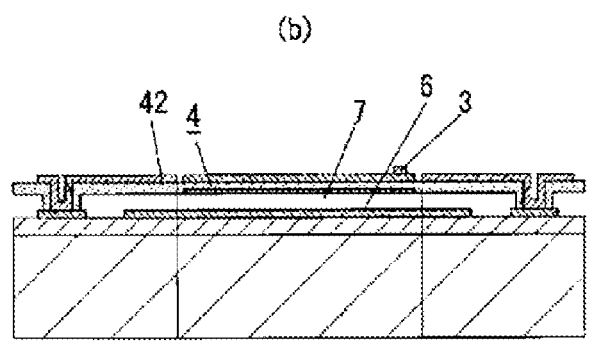
Figure 16A:
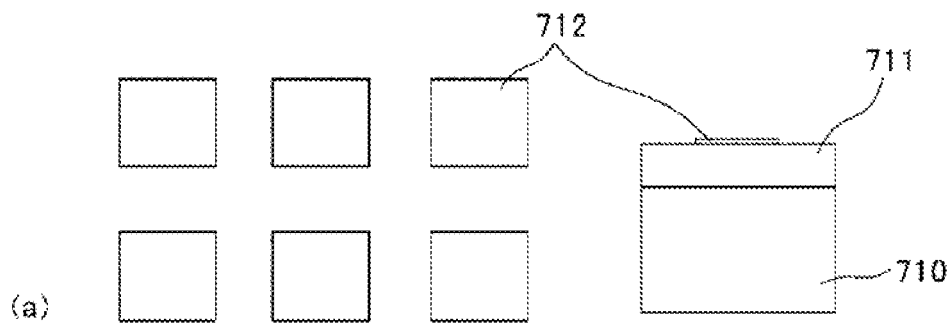
FIGS. 16A to 16D show a top view of the structure of the bolometer of a related art (Patent Literature 2).
Figure 16B:
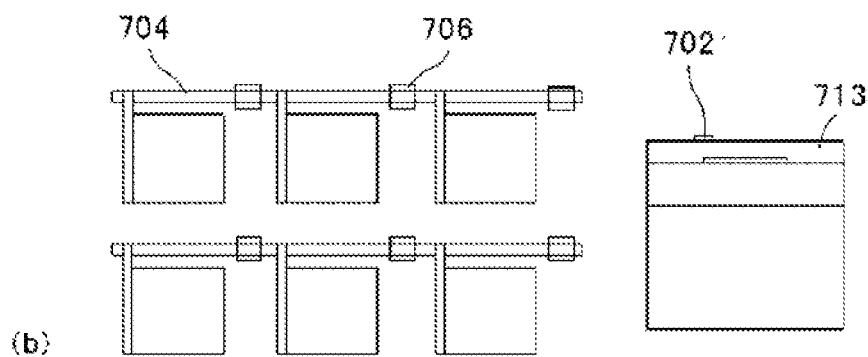
Figure 16C:
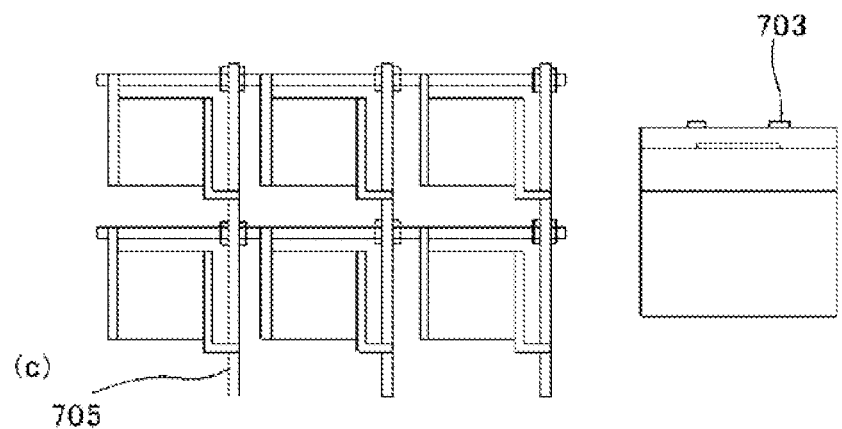
Figure 16D:
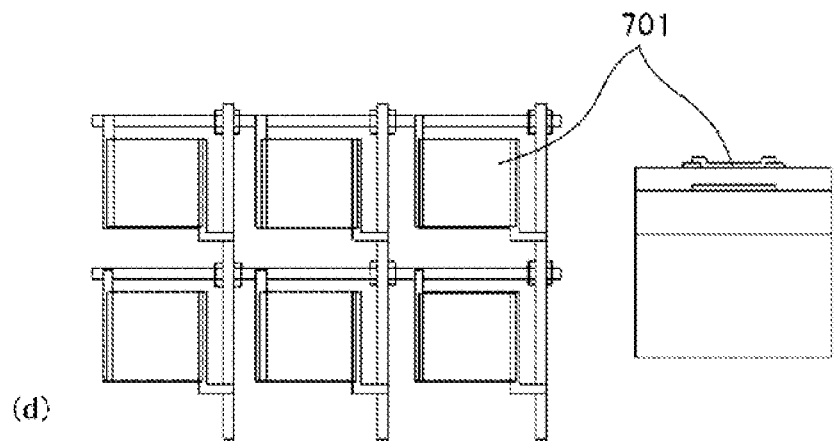

The heat insulating layer 102-1, and the heat insulating layers 102-2 and 102-3, the latter of which will be described later, are layers that block heat transfer from the bolometer films 105 to the substrate 101. In the bolometer of the related art, a gap is provided as the structure that blocks the heat transfer from the bolometer films to the substrate, as shown in FIG. 15, and the formation of such gap requires a complicated manufacturing process. On the other hand, the heat insulating layer in the present embodiment can be formed, for example, in a printing process, eliminating the need for a complicated manufacturing process. Another advantage of the bolometer according to the present embodiment is eliminating the need for vacuum packaging while the bolometer of the related art requires vacuum packaging of the entire device to maintain a vacuum in the gap.

It is preferable that a resin component having low thermal conductivity is used for the heat insulating layer 102-1. The thermal conductivity of the resin component used for the heat insulating layer is lower than the thermal conductivity of the substrate 101, for example, ranging from 0.02 to 0.3 (W/mK), preferably ranging from 0.05 to 0.15 (W/mK).

In the bolometer-type detector according to the present embodiment, which reduces the inter-pixel heat inflow by removing the inter-pixel heat insulating layer, even a material having low insulation in the horizontal direction can be employed as the material of the heat insulating layer as long as the heat insulation in the vertical direction (stacking direction) falls within a desired range.

Examples of such resin component include parylene, but not limited thereto. Parylene is a generic term for paraxylene-based polymers, and has a structure in which benzene rings are linked via $CH_2$.

Examples of parylene include those formed from the dimers represented by the general formula:

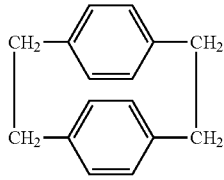

wherein at least one of hydrogen atoms of at least one of benzene rings may be substituted by halogen atom. Halogen includes fluorine (F), chlorine (Cl), bromine (Br), and iodine (I), and chlorine is more preferred.

Parylene includes parylene N, parylene C, parylene D, parylene HT and the like, and among them, parylene C (heat conductivity: 0.084 (W/mK)) having the lowest heat conductivity is suitable.

The thickness of the heat insulating layer 102-1 can be appropriately set in considering the heat conductivity of the component to use, and in a case of using parylene C for example, the thickness of the heat insulating layer 102-1 can be in the range of, for example, 100 nm to 30 μm, preferably 300 nm to 10 μm, and more preferably 500 nm to 5 μm.

The total thickness of the heat insulating layer 102-1 and the heat insulating layer 102-1 and 102-3 described later can be for example 5 μm to 50 μm, preferably 10 μm to 20 μm.

The manufacturing method of the heat insulating layer 102-1 is not particularly limited and can be appropriately set in considering the material of the heat insulating layer. For example, when a parylene film is used as the heat insulating layer, the parylene film can be formed by coating a desired area with parylene using a vacuum vapor deposition apparatus. Specifically, when solid dimer is heated under vacuum, it vaporizes to become dimer gas. This gas is thermally decomposed and the dimer is cleaved to a monomer form. In the vapor deposition chamber at room temperature, this monomer gas polymerizes on all surfaces to form a thin, transparent polymer film. If necessary, pretreatment of the substrate, cleaning of the substrate, and masking of the areas that should not be deposited may be performed before the vapor deposition process is performed.

Figure 4:
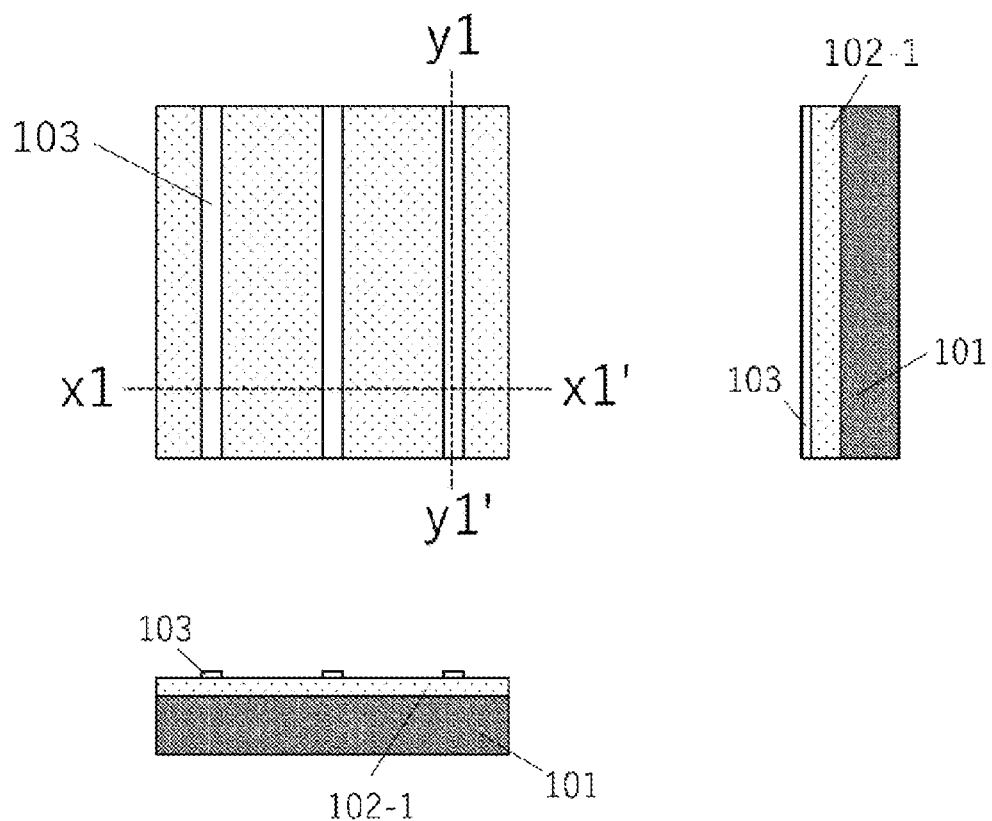
FIG. 4 shows a step of the method of manufacturing a bolometer according to one embodiment of the present invention (center: top view, right: cross-sectional view at y1-y1' position, bottom: cross-sectional view at x1-x1' position.

Step 3: Formation of a Wiring for Signal Output (FIG. 4)

The wiring for signal output (vertical wiring) 103 is then formed.

In the bolometer-type detector according to the present embodiment, metal wiring for signal output (signal extraction wiring) is disposed in a layer different from the bolometer films. As a result, the inter-pixel heat transfer via the metal wiring having high thermal conductivity can be reduced. Since each wiring can be disposed in close proximity to the bolometer films, a high fill factor can be achieved.

Aluminum, gold, copper, tungsten, cobalt, and alloys made thereof and the like can be used as the material of the wiring for signal output. The wiring for signal output can be formed by vapor deposition or printing after patterning, for example, with a metal mask as required.

Figure 5:
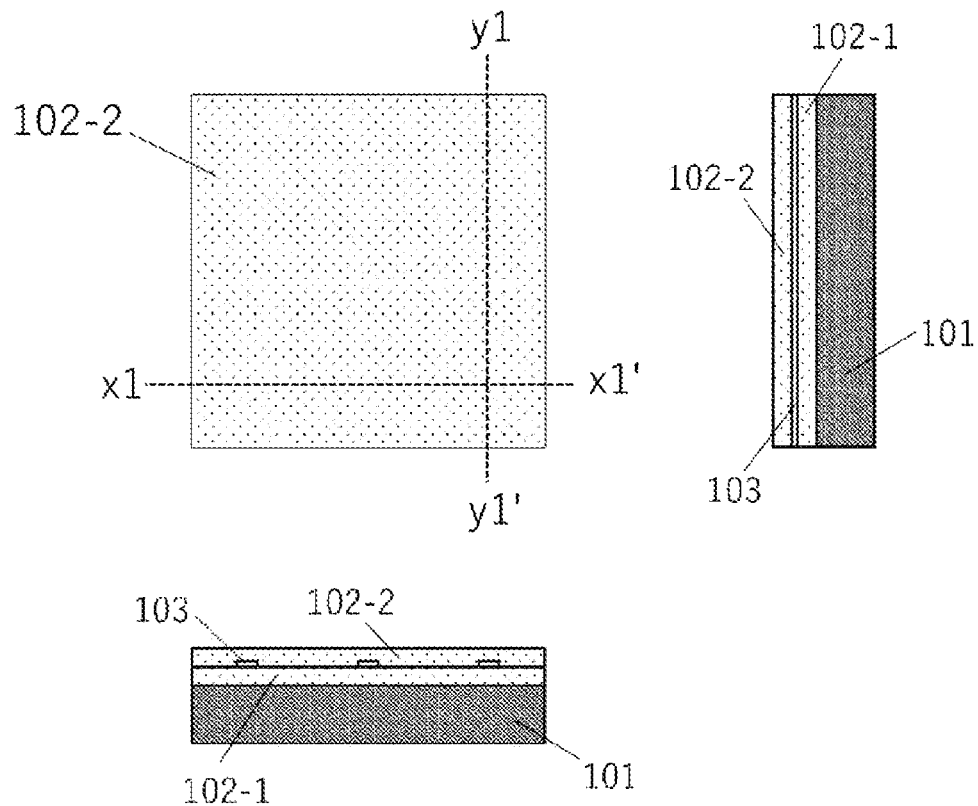
FIG. 5 shows a step of the method of manufacturing a bolometer according to one embodiment of the present invention (center: top view, right: cross-sectional view at y1-y1' position, bottom: cross-sectional view at x1-x1' position.

Step 4: Formation of Second Heat Insulating Layer 102-2 (FIG. 5)

The second heat insulating layer 102-2 is then formed on the first heat insulating layer 102-1, on which the formed wiring 103 for signal output has been formed.

For the second heat insulating layer 102-2, the same material of the first heat insulating layer 102-1 may be used, or a material different therefrom may also be used. The second heat insulating layer 102-2 can also function as an insulating layer that isolates the wiring 103 and 104 for signal output from each other.

The thickness of the second heat insulating layer 102-2 can be selected as appropriate in accordance with the material thereof. For example, when parylene such as parylene C is used, the thickness can range from 100 nm to 30 μm, preferably from 300 nm to 10 μm, more preferably from 500 nm to 5 μm.

The second heat insulating layer 102-2 can be formed in the same method as the method in accordance with which the first heat insulating layer 102-1 is formed.

Figure 6:
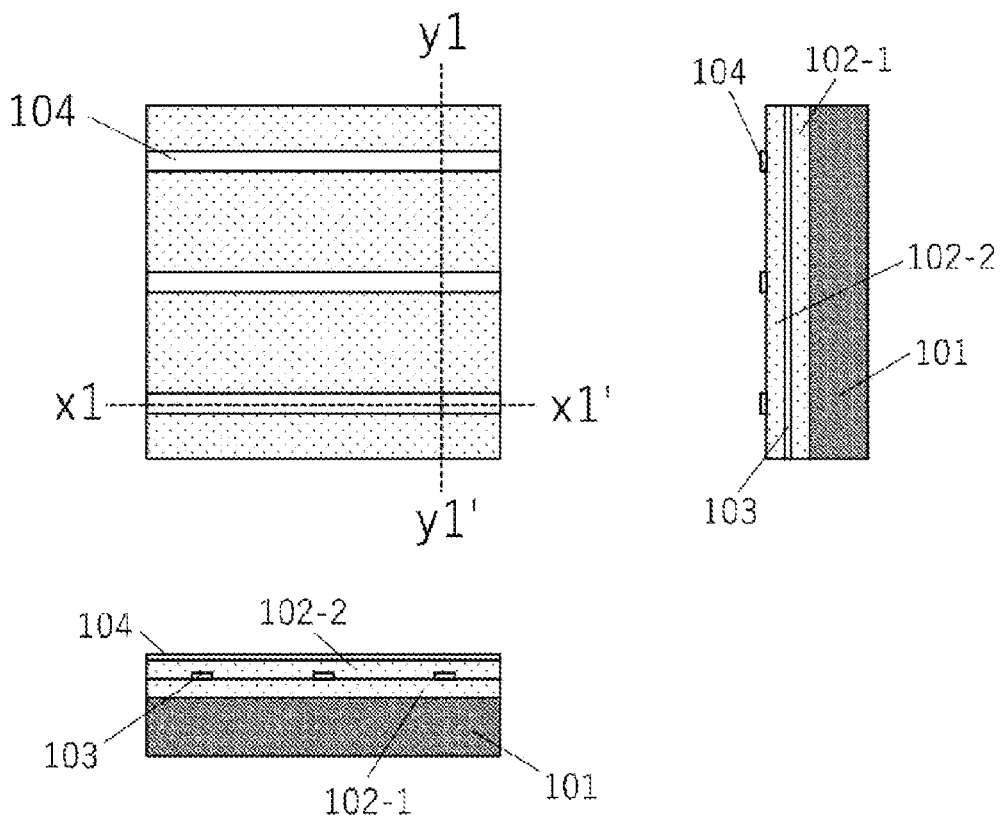
FIG. 6 shows a step of the method of manufacturing a bolometer according to one embodiment of the present invention (center: top view, right: cross-sectional view at y1-y1' position, bottom: cross-sectional view at x1-x1' position.

Step 5: Formation of Wiring for Signal Output (FIG. 6)

The other wiring for signal output (horizontal wiring) 104 is then formed on the second heat insulating layer 102-2.

The wiring for signal output 104 can be formed, for example, so as to be roughly perpendicular to the wiring for signal output 103 (vertical wiring).

The wiring for signal output 104 can be formed by using the same material and method as those in accordance with which the wiring for signal output 103 is formed.

Figure 7:
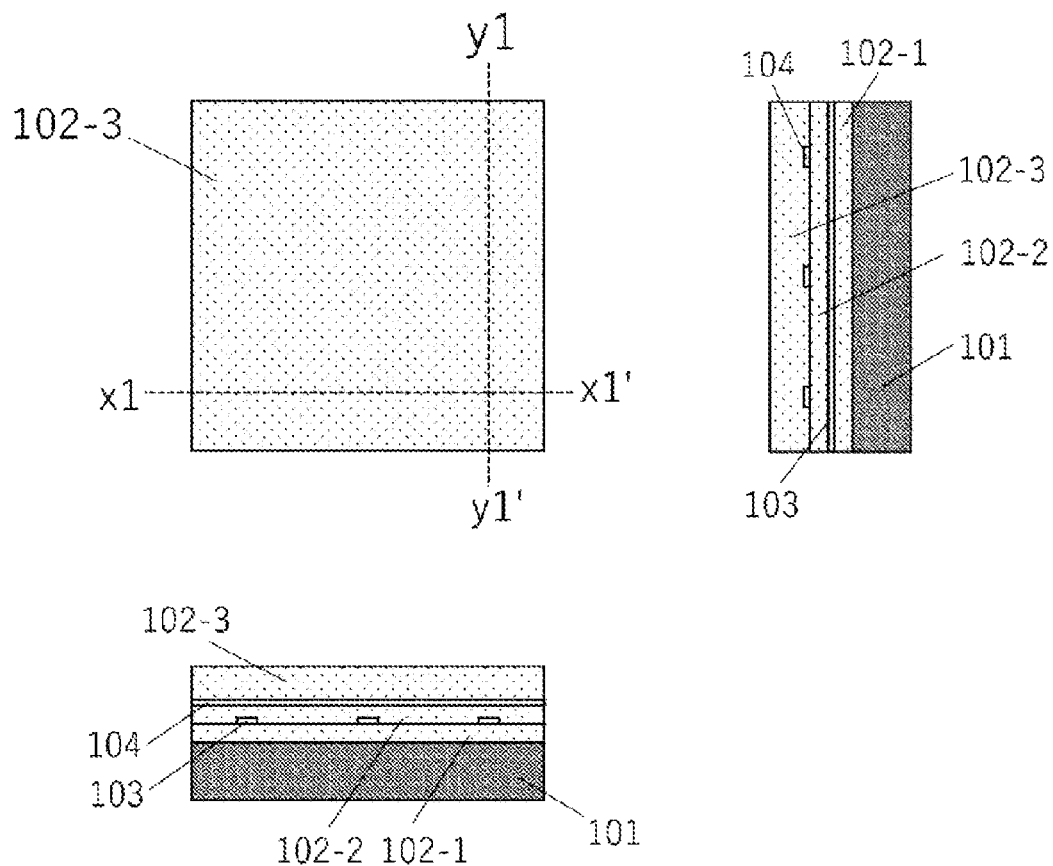
FIG. 7 shows a step of the method of manufacturing a bolometer according to one embodiment of the present invention (center: top view, right: cross-sectional view at y1-y1' position, bottom: cross-sectional view at x1-x1' position.

Step 6: Formation of Third Heat Insulating Layer 102-3 (FIG. 7)

The third heat insulating layer 102-3 is then formed on the second heat insulating layer 102-2, on which the wiring for signal output 104 has been formed.

For the third heat insulating layer 102-3, the same material of the first heat insulating layer 102-1 or the second heat insulating layer 102-2 may be used, or a material different therefrom may also be used.

The thickness of the third heat insulating layer 102-3 can be selected as appropriate in accordance with the material thereof. For example, when parylene such as parylene C is used, the thickness can range from 100 nm to 30 μm, preferably from 300 nm to 10 μm, more preferably from 500 nm to 5 μm.

The third heat insulating layer 102-3 can be formed in the same method as the method in accordance with which the first heat insulating layer 102-1 or the second heat insulating layer 102-2 is formed.

Figure 8:
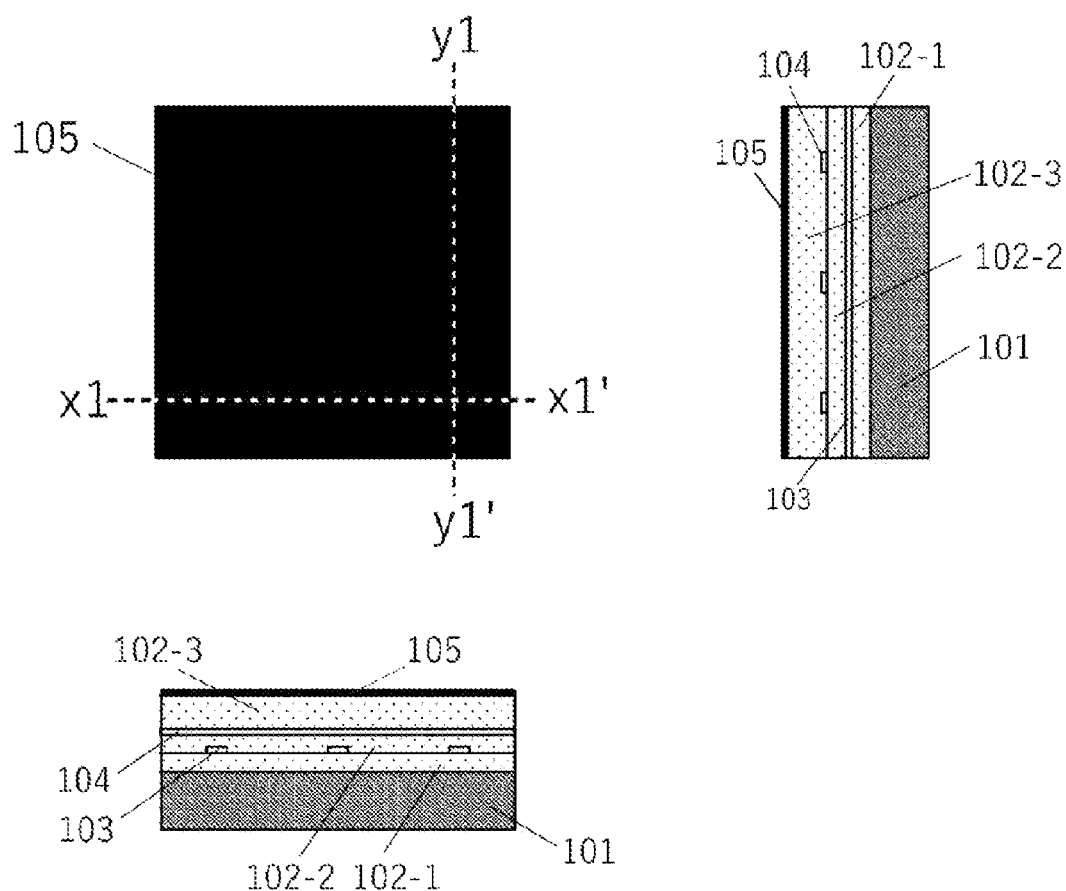
FIG. 8 shows a step of the method of manufacturing a bolometer according to one embodiment of the present invention (center: top view, right: cross-sectional view at y1-y1' position, bottom: cross-sectional view at x1-x1' position.

Step 7: Formation of Bolometer Films (FIG. 8)

The bolometer films 105 are then formed on the third heat insulating layer 102-3.

The bolometer-type detector according to the present embodiment can be used to detect a desired electromagnetic wave, and the bolometer films can be made of a thermo-electric conversion material selected as appropriate in accordance with heat or electromagnetic waves to be detected.

Examples of the material of the bolometer films include, but are not limited to, a titanium film and a vanadium oxide film, which are used in related art, as well as an organic thin film made of an organic material (carbon nanotube film, carbon nanohorn film, and carbon nanobrush film, for example).

The bolometer films 105 may be formed in such a manner as to form a bolometer film layer over the entire substrate or over a plurality of pixels and then separate the bolometer film on a pixel basis as shown in FIG. 8, or may be formed on every pixel.

In the bolometer-type detector according to the present embodiment, since the metal wiring for signal output (vertical wiring 103 and horizontal wiring 104) are disposed in a layer different from the bolometer films 105, there is no need to increase the inter-pixel distance to prevent the inter-pixel heat transfer, whereby a high fill factor can be achieved.

The distance between the bolometer films (width of inter-pixel heat insulating layer) is not limited to a specific value as long as a width in which the heat insulating layer is removed as described above is ensured. In an embodiment, it is preferable that the distance between the bolometer films (width of inter-pixel heat insulating layer) is roughly equal to or greater than the depth to which the heat insulating layer described above is removed. The upper limit of the distance is also not limited to a specific value, however it can be 20 µm or smaller, preferably 10 µm or smaller, for example, and from the viewpoint of improvement of the fill factor, 5 µm or smaller is also preferable.

The pixel pitch is not limited to a specific value and can be set as appropriate in consideration, for example, of a required number of pixels. From the viewpoint of ease of manufacturing process, the pixel pitch is preferably 5 µm or greater, more preferably 10 µm or greater, and from the viewpoint of high definition of images, 100 µm or smaller is preferable, 50 µm or smaller is more preferable.

A carbon nanotube film that is an example of a preferred bolometer film will be described later.

Step 8: Formation of Contact Electrodes (FIG. 9)

The contact electrodes 106 are then formed for each of the pixels so as to be in contact with the bolometer films 105.

Figure 9:
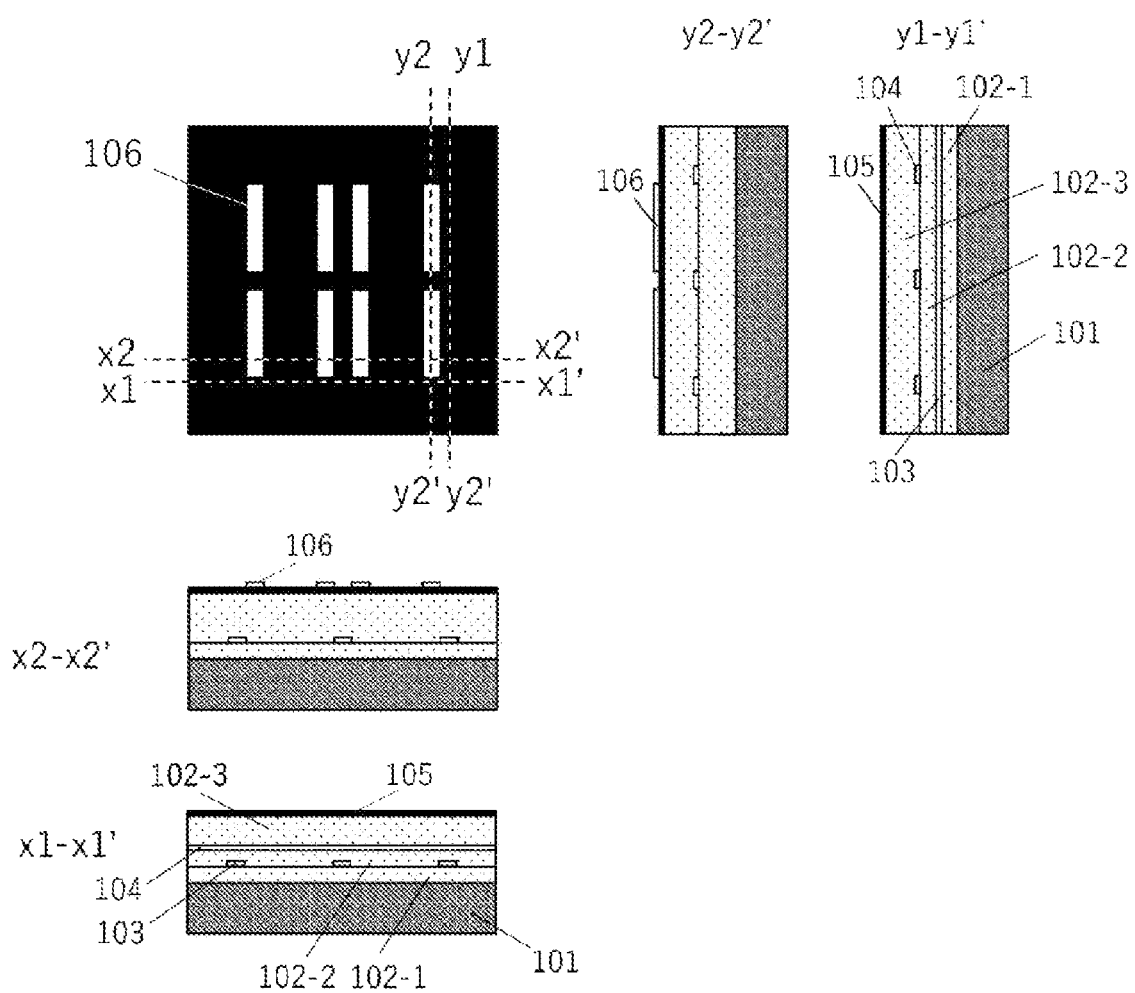
FIG. 9 shows a step of the method of manufacturing a bolometer according to one embodiment of the present invention (center: top view, right: cross-sectional view at y1-y1' and y2-y2' positions, bottom: cross-sectional view at x1-x1' and x2-x2' positions.

The contact electrodes 106 may be formed on the bolometer films 105 as shown in FIG. 9 or below the bolometer films 105.

The thickness of the contact electrodes can be adjusted as appropriate, and preferably ranges from 10 nm to 1 mm, more preferably from 50 nm to 1 µm. The distance between the electrodes preferably ranges from 1 µm to 500 µm, more preferably ranges from 5 to 200 µm for size reduction.

The contact electrodes can be made, for example, using gold, platinum, or titanium, singly or in combination. A method for producing the electrodes is not limited to a specific method, and the electrodes can be formed, for example, by vapor deposition, sputtering, or printing. Regions where the contact electrodes 106 should not be formed may be masked in advance as required.

Figure 10:
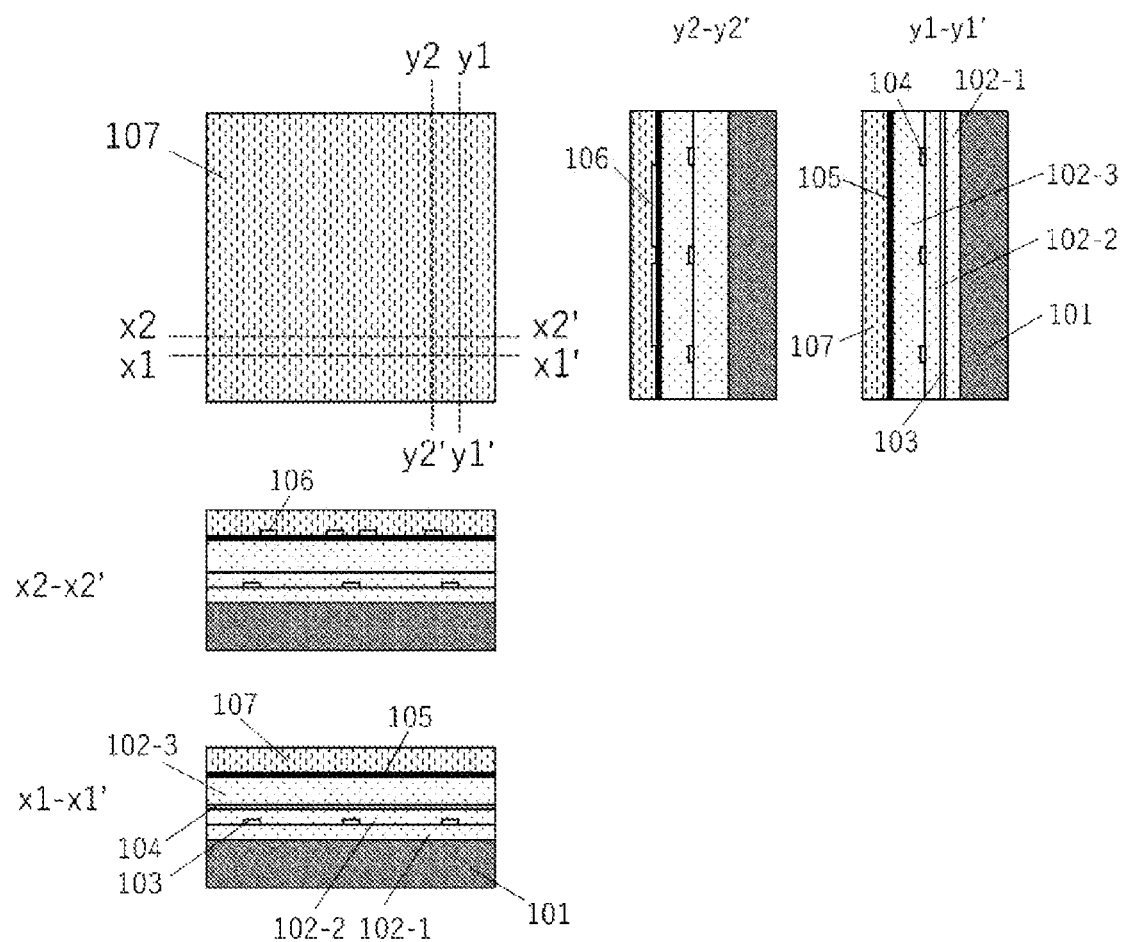
FIG. 10 shows a step of the method of manufacturing a bolometer according to one embodiment of the present invention (center: top view, right: cross-sectional view at y1-y1' and y2-y2' positions, bottom: cross-sectional view at x1-x1' and x2-x2' positions.

Step 9: Formation of Protective Layer (FIG. 10)

The protective layer 107 is then formed on the bolometer films 105.

The protective layer has the effect of inhibiting doping to the bolometer films (carbon nanotube films) due to adsorption of oxygen and other substances, and also in some cases has the effect, for example, of increasing the light absorption rate due to the fact that the protective layer as well as the bolometer films absorbs the light to be detected.

The protective layer can be made of without restriction any material used as a protective layer in a bolometer, and is preferably a material having high transparency in the range of wavelengths to be detected. Examples of the material include, but not limited to, silicon nitride (SiN) described with reference to FIG. 1 by way of example, as well as silicon oxide ($SiO_2$), resins used in a heat insulating layer, such as parylene, PMMA, PMMA anisole, and other acrylic resins, epoxy resins, and Teflon®. The thickness of the protective layer can, for example, range from 5 nm to 50 nm depending on the material.

The protective layer may be formed across the entire substrate as shown in FIG. 10 or over a plurality of pixels, and may then be divided into protective films on a pixel basis, or the protective layer may be formed on each of the pixels.

Figure 11:
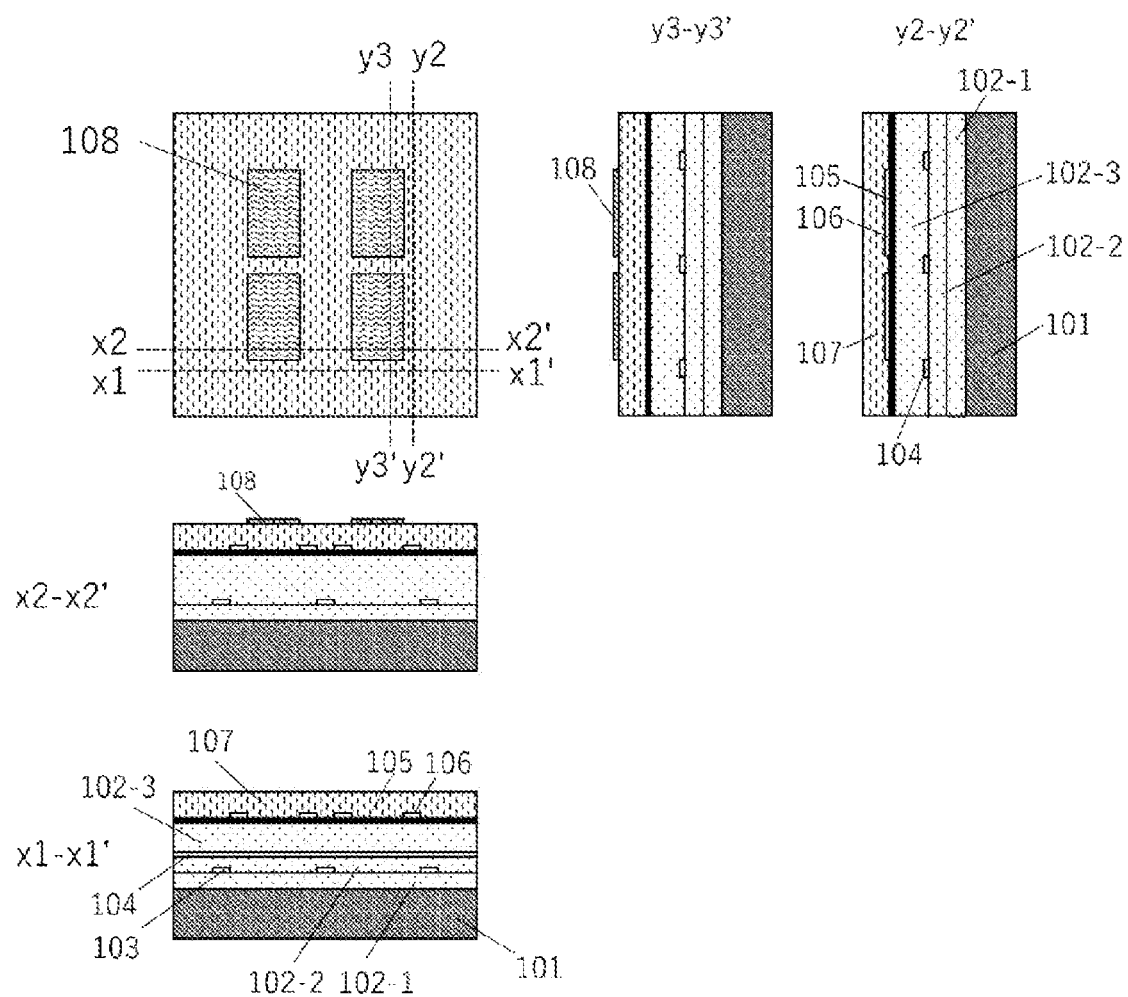
FIG. 11 shows a step of the method of manufacturing a bolometer according to one embodiment of the present invention (center: top view, right: cross-sectional view at y2-y2' and y3-y3' positions, bottom: cross-sectional view at x1-x1' and x2-x2' positions.
Figure 12:
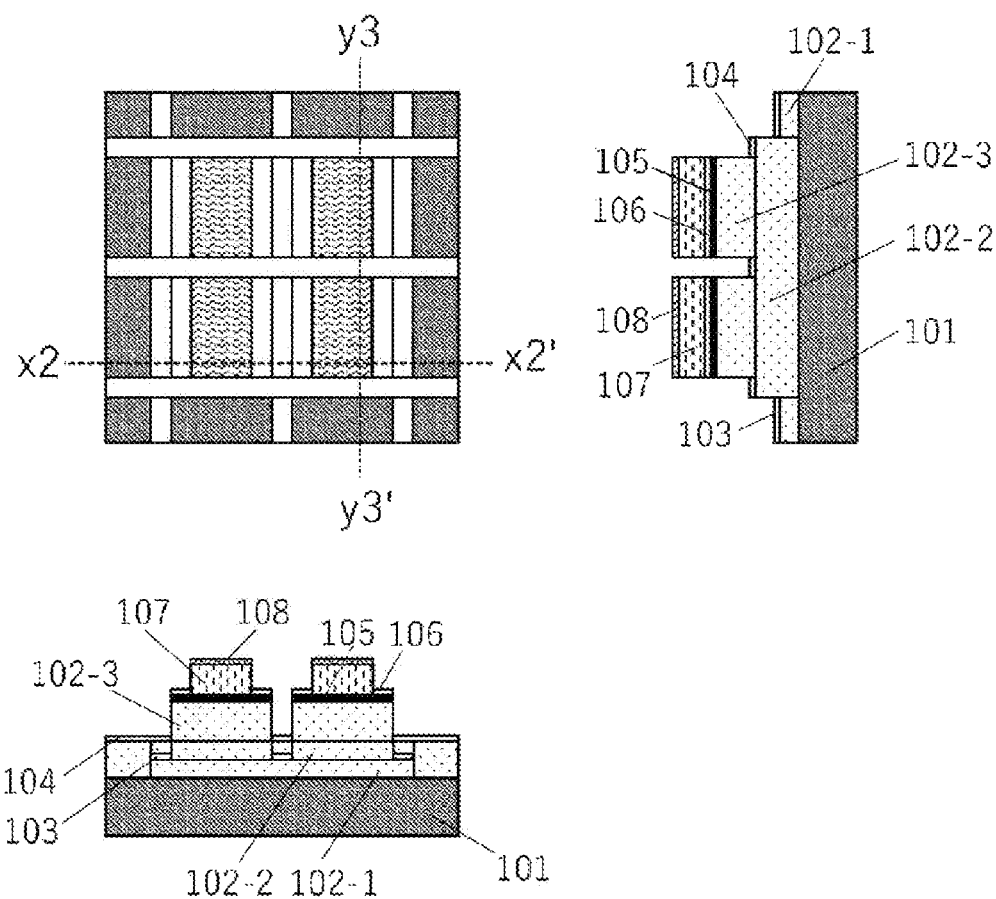
FIG. 12 shows a step of the method of manufacturing a bolometer according to one embodiment of the present invention (center: top view, right: cross-sectional view cut at y3-y3' position, bottom: front view cut at x2-x2' position.
Figure 13:
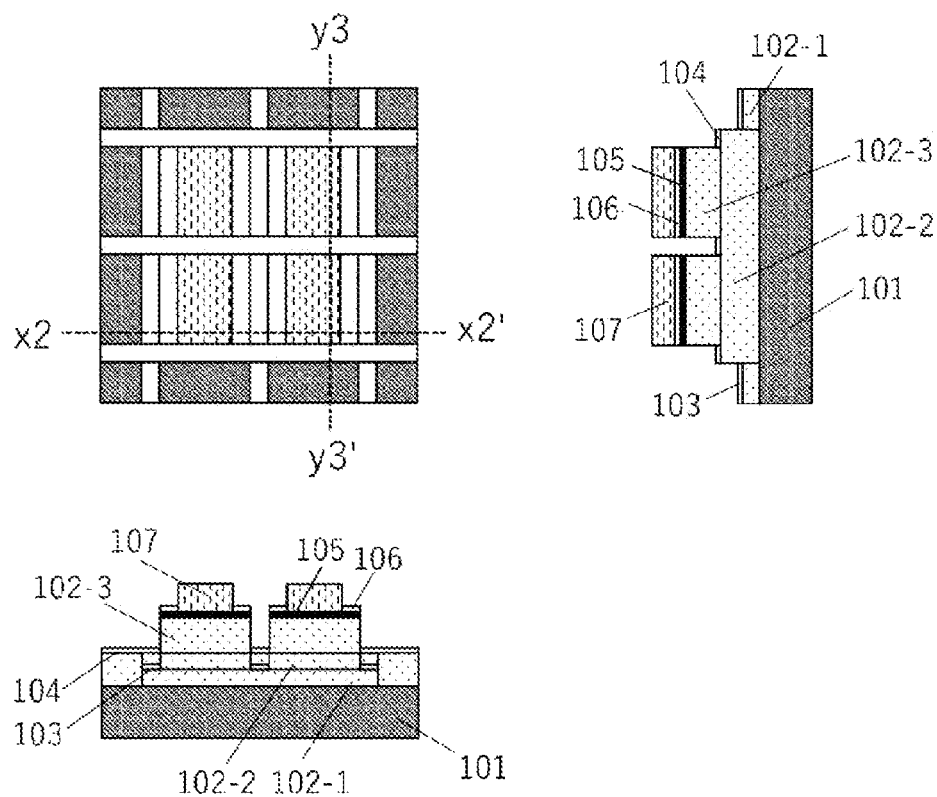
FIG. 13 shows a step of the method of manufacturing a bolometer according to one embodiment of the present invention (center: top view, right: cross-sectional view cut at y3-y3' position, bottom: front view cut at x2-x2' position.

Step 10: Removal of Heat Insulating Layer (FIGS. 11 to 13)

At least part of the heat insulating layers 102 between adjacent pixels (between adjacent bolometer films) is then removed. Removal of at least part of the heat insulating layers (division of heat insulating layers on a pixel basis) allows reduction in the inter-pixel heat inflow via the heat insulating layers.

The region and depth of the heat insulating layers to be removed have been described above.

In an embodiment, it is preferable to remove the heat insulating layers to the depth of each signal extraction wiring.

When the heat insulating layers are removed to the depth of each signal extraction wiring, the metal of the signal extraction wiring is exposed to the surface of the region where the heat insulating layers are removed (that is, exposed metal also serves as wiring for signal output), so that there is no need for formation of contact holes or the like that connect the contact electrodes to the signal extraction wiring via the connection electrodes, advantageously simplifying the manufacturing process.

When the heat insulating layers are etched away as will be described later, the metal signal extraction wiring can be used as an etching stop layer to divide the heat insulating layers on a pixel basis in a simple process. When the width of the signal extraction wiring is smaller than the width of the inter-pixel region, for example, the heat insulating layers may be removed all the way to the depth of substrate in the region where no wiring exists.

A method for removing at least part of the heat insulating layers is not limited to a particular method, and examples of the method include etching (such as dry etching and wet etching) and mechanical removal (such as dicer and drilling). From the viewpoint of elaborate processing, dry etching, especially anisotropic dry etching such as reactive ion etching (RIE), is preferable.

To perform the etching, an etching mask 108 is formed as required in advance on the region to be protected from the etching. In an embodiment, even when the bolometer films (and protective layer) are formed across the entire substrate as shown in FIGS. 8 and 10, by forming an etching mask at least on the region of the bolometer film at each pixel and performing etching, the bolometer films (and protective layer) can be divided on a pixel basis (namely, divided into each pixels) simultaneously with the removal of the inter-pixel heat insulating layers, whereby the manufacturing process can be simplified. A method for forming the etching mask is not limited to a specific method, and examples of the method include a method for forming a mask pattern by using photolithography with a metal such as gold, and a method for forming the mask pattern by using photoresist.

Figure 14:
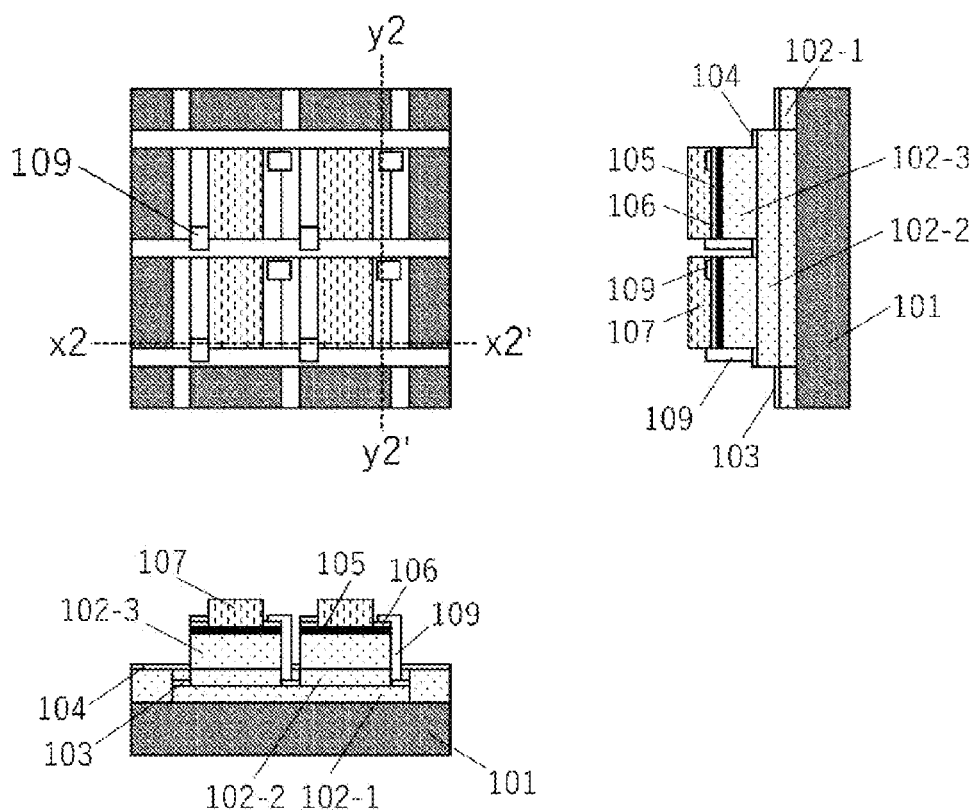
FIG. 14 shows a step of the method of manufacturing a bolometer according to one embodiment of the present invention (center: top view, right: cross-sectional view cut at y2-y2' position, bottom: front view at x2-x2' position.

Step 11: Formation of Connection Electrodes (FIG. 14)

The contact electrodes 106, which are provided so as to be in contact with the bolometer films 105, are then connected to the wirings 103 and 104 for signal extraction via the connecting electrodes 109.

Examples of the material of the connection electrodes 109 include a titanium film or the like.

The connection electrodes 109 can be formed, for example, by vapor deposition or sputtering. When the heat insulating layers 102 are present at the positions where the connection electrodes should be formed, contact holes or other components may be formed as required.

A protective layer may be provided on the formed connection electrodes 109.

A bolometer-type detector according to the present embodiment can be manufactured by the above steps.

A carbon nanotube film is described in detail below as an example of the bolometer film 105.

The bolometer-type detector using a carbon nanotube film can be particularly preferably used for detecting an electromagnetic wave having a wavelength of 0.7 µm to 1 mm. The electromagnetic waves included in this wavelength range include, in addition to infrared ray, terahertz wave. The bolometer of the present embodiment is preferably an infrared sensor.

The carbon nanotube film as a bolometer film is a thin film composed of a plurality of carbon nanotubes forming conductive paths which electrically connect a pair of contact electrodes. Carbon nanotubes may form a structure such as, for example, parallel, fibrous, and network, and preferably form a three-dimensional network structure because aggregation is less likely to occur and uniform conductive paths can be obtained.

As the carbon nanotubes, single-walled, double-walled, and multi-walled carbon nanotubes may be used, and from the view point of separating semiconducting carbon nanotubes, single-walled or few-walled (for example, double-walled or triple-walled) carbon nanotubes are preferred, and single-walled carbon nanotubes are more preferred. The carbon nanotubes the single-walled carbon nanotubes in an amount of 80% by mass or more, and more preferably 90% by mass or more (including 100% by mass).

The diameter of the carbon nanotubes is preferably between 0.6 and 1.5 nm, more preferably 0.6 nm to 1.2 nm, and further preferably 0.7 to 1.1 nm, from the viewpoint of increasing the band gap to improve TCR. In one embodiment, it may be particularly preferably 1 nm or less in some cases. When the diameter is 0.6 nm or more, the manufacture of carbon nanotubes becomes much easier. When the diameter is 1.5 nm or less, the band gap is easily maintained in an appropriate range and a high TCR can be obtained.

As used herein, the diameter of the carbon nanotubes means that when the carbon nanotubes on the heat insulating layer or of a formed thin film are observed using an atomic force microscope (AFM) and the diameter thereof is measured at about 100 positions, 60% or more, preferably 70% or more, optionally preferably 80% or more, more preferably 100% thereof is within a range of 0.6 to 1.5 nm. It is preferred that 60% or more, preferably 70% or more, optionally preferably 80% or more, and more preferably 100% thereof be within a range of 0.6 to 1.2 nm, and further preferably within a range of 0.7 to 1.1 nm. In one embodiment, 60% or more, preferably 70% or more, optionally preferably 80% or more, and more preferably 100% thereof is within a range of 0.6 to 1 nm.

The length of the carbon nanotubes is preferably between 100 nm to 5 µm because dispersion is easy and application properties are excellent. Also, from the viewpoint of conductivity of the carbon nanotubes, the length is preferably 100 nm or more. When the length is 5 µm or less, aggregation on the heat insulating layer, and/or upon forming a film is easily suppressed. The length of the carbon nanotubes is more preferably 500 nm to 3 µm, and further preferably 700 nm to 1.5 µm.

As used herein, the length of the carbon nanotubes means that, when at least 100 carbon nanotubes are observed using an atomic force microscope (AFM) and enumerated to measure the distribution of the length of the carbon nanotubes, 60% or more, preferably 70% or more, optionally preferably 80% or more, and more preferably 100% thereof is within a range of 100 nm to 5 µm. It is preferred that 60% or more, preferably 70% or more, optionally preferably 80% or more, and more preferably 100% thereof be within a range of 500 nm to 3 µm, and it is more preferred that 60% or more, preferably 70% or more, optionally preferably 80% or more, and more preferably 100% thereof be within a range of 700 nm to 1.5 µm.

When the diameter and length of the carbon nanotubes are within the above range, the influence of semiconductive properties becomes large and a large current value can also be obtained, and thus, a high TCR value is likely to be obtained when the carbon nanotubes are used as a bolometer film.

For the bolometer film, semiconducting carbon nanotubes having a large band gap and carrier mobility are preferably used. The content of the semiconducting carbon nanotubes, preferably single-walled semiconducting carbon nanotubes in carbon nanotubes is generally 67% by mass or more, more preferably 70% by mass or more, particularly preferably 80% by mass or more, and in particular, preferably 90% by mass or more, more preferably 95% by mass or more, and further preferably 99% by mass or more (the upper limit may be 100% by mass). In the present specification, the ratio (mass %) of semiconducting carbon nanotubes in carbon nanotubes may be referred to as "semiconducting purity".

The thickness of the bolometer film is not limited, in the range of, for example, 1 nm or more, for example a few nm to 10 µm, preferably 10 nm to 10 µm, more preferably 50 nm to 1 µm. In one embodiment, it is preferably 20 nm to 500 nm, more preferably 50 nm to 200 nm or more.

When the thickness of the bolometer film is 1 nm or more, a good light absorption rate can be achieved.

When the thickness of the carbon nanotube film is 10 nm or more, preferably 50 nm or more, the element structure can be made simpler because an adequate light absorption rate is obtained even without comprising a light reflection layer or a light absorbing material layer.

In addition, from the view point of simplifying the manufacturing method, it is preferred that the thickness of the bolometer film is 1 µm or less, preferably 500 nm or less. Also, when the bolometer film is too thick, the contact electrode deposited from above may not fully contact the carbon nanotubes at the bottom side of the bolometer film, and the effective resistance value becomes higher, but when the thickness is within the above range, increase of the resistance value can be suppressed.

Also, in the case of comprising a light reflection layer or a light absorbing material layer, it is also possible to make the bolometer film thinner than the above range in order to further simplify the manufacturing process and improve the resistance value.

Also, when the thickness of the bolometer film is in the range of 10 nm to 1 µm as described above, it is also preferable that printing techniques can be suitably applied to the manufacturing method of the bolometer film.

The thickness of the bolometer film can be determined as an average value of the thickness of the carbon nanotube film measured at arbitrary 10 positions.

The density of the bolometer film is, for example, 0.3 g/cm$^3$ or more, preferably 0.8 g/cm$^3$ or more, more preferably 1.1 g/cm$^3$ or more. The upper limit thereof is not particularly limited, but can be the upper limit of the true density of the carbon nanotube used (for example, about 1.4 g/cm$^3$).

When the density of the bolometer film is 0.3 g/cm$^3$ or more, a good light absorbing rate can be achieved.

When the density of the bolometer film is 0.5 g/cm$^3$ or more, it is preferred that the element structure can be simplified because an adequate light absorption rate is obtained even without comprising a light reflection layer or a light absorbing material layer.

Also, when a light reflection layer or a light absorbing material layer is comprised, the density of the bolometer film of lower than the above-described density may be appropriately employed.

The density of the bolometer film can be calculated from weight, area, and the thickness obtained as above of the carbon nanotube film.

In addition to the above-mentioned components described above, negative thermal expansion materials described later, ionic conductors (surfactants, ammonium salts, inorganic salts), resins, organic binding agents, and the like may also be appropriately used in the bolometer film.

The content of carbon nanotubes in the bolometer film can be selected appropriately, and preferably more than 0.1% by mass or more based on the total mass of the bolometer film is effective, more preferably 1% by mass or more is effective, for example 30% by mass, and even 50% by mass or more may also be preferred, and in some cases 60% by mass or more may be preferred.

An example of a method for manufacturing a carbon nanotube film is described in detail below.

A carbon nanotube film can be formed using, for example, a carbon nanotube dispersion liquid comprising carbon nanotubes and a nonionic surfactant.

From the carbon nanotubes, surface functional groups and impurities such as amorphous carbon, catalysts, and the like may be removed by performing a heat treatment under an inert atmosphere, in a vacuum. The heat treatment temperature may be appropriately selected and is preferably 800 to 2000° C., and more preferably 800 to 1200° C.

The nonionic surfactant may be appropriately selected, and it is preferred to use nonionic surfactants constituted by a hydrophilic portion which is not ionized and a hydrophobic portion such as an alkyl chain, for example, nonionic surfactants having a polyethylene glycol structure exemplified by polyoxyethylene alkyl ethers, and alkyl glucoside based nonionic surfactants, singly or in combination. As such a nonionic surfactant, polyoxyethylene alkyl ether represented by Formula (1) is preferably used. In addition, the alkyl moiety may have one or a plurality of unsaturated bonds.

$$C_nH_{2n+1}(OCH_2CH_2)_mOH \qquad (1)$$

wherein, n=preferably 12 to 18, and m=10 to 100, and preferably 20 to 100.

In particular, a nonionic surfactant specified by polyoxyethylene (n) alkyl ether (wherein n=20 or more and 100 or less, and the alkyl chain length is C12 or more and C18 or less) such as polyoxyethylene (23) lauryl ether, polyoxyethylene (20) cetyl ether, polyoxyethylene (20) stearyl ether, polyoxyethylene (10) oleyl ether, polyoxyethylene (10) cetyl ether, polyoxyethylene (10) stearyl ether, polyoxyethylene (20) oleyl ether, polyoxyethylene (100) stearyl ether is more preferred. In addition, N, N-bis[3-(D-gluconamido)propyl]deoxycholamide, n-dodecyl-D-maltoside, octyl-D-glucopyranoside, and digitonin may also be used.

As the nonionic surfactant, polyoxyethylene sorbitan monostearate (molecular formula: $C_{64}H_{126}O_{26}$, trade name: Tween 60, manufactured by Sigma-Aldrich, etc.), polyoxyethylene sorbitan trioleate (molecular formula: $C_{24}H_{44}O_6$, trade name: Tween 85, manufactured by Sigma-Aldrich, etc.), octylphenol ethoxylate (molecular formula: $C_{14}H_{22}O(C_2H_4O)_n$, n=1 to 10, trade name: Triton X-100, manufactured by Sigma-Aldrich, etc.), polyoxyethylene (40) isooctylphenyl ether (molecular formula: $C_8H_{17}C_6H_{40}(CH_2CH_2O)_{40}H$, trade name: Triton X-405, manufactured by Sigma-Aldrich, etc.), poloxamer (molecular formula: $C_5H_{10}O_2$, trade name: Pluronic, manufactured by Sigma-Aldrich, etc.), polyvinyl pyrrolidone (molecular formula: $(C_6H_9NO)_n$, n=5 to 100, manufactured by Sigma-Aldrich, etc.) may be used.

The method for obtaining a dispersion solution of carbon nanotubes is not particularly limited, and conventionally known methods can be applied. For example, a carbon nanotube mixture, a dispersion medium, and a nonionic surfactant are mixed to prepare a solution containing carbon nanotubes, and this solution is subjected to sonication to disperse the carbon nanotubes, thereby preparing a carbon nanotube dispersion liquid (micelle dispersion solution). The dispersion medium is not particularly limited, as long as it is a solvent that allows carbon nanotubes to disperse and suspend during the separation step, and for example, water, heavy water, an organic solvent, an ionic liquid, or a mixture thereof may be used, and water and heavy water are preferred. In addition to or instead of the sonication mentioned above, a technique of dispersing carbon nanotubes by a mechanical shear force may be used. The mechanical shearing may be performed in a gas phase. In a micelle dispersion aqueous solution of the carbon nanotubes and the nonionic surfactant, the carbon nanotubes are preferably in an isolated state. Thus, if necessary, bundles, amorphous carbon, impurity catalysts, and the like may be removed using an ultracentrifugation treatment. During the dispersion treatment, the carbon nanotubes can be cut, and the length thereof can be controlled by changing the grinding conditions of the carbon nanotubes, ultrasonic output, ultrasonic treatment time, and the like. For example, the aggregate size can be controlled by grinding the untreated carbon nanotubes using tweezers, a ball mill, or the like. After these treatments, the length can be controlled to 100 nm to 5 μm using an ultrasonic homogenizer by setting the output to 40 to 600 W, optionally 100 to 550 W, 20 to 100 KHz, the treatment time to 1 to 5 hours, preferably up to 3 hours. When the treatment time is shorter than 1 hour, the carbon nanotubes may be hardly dispersible depending on the conditions, and may remain almost the original length in some cases. From the viewpoint of shortening the dispersion treatment time and reducing the cost, the treatment time is preferably 3 hours or less. The present embodiment may also have the advantage of ease of adjustment of cutting due to use of a nonionic surfactant. In addition, it has the advantage of containing no ionic surfactant which is difficult to be removed.

Dispersion and cutting of the carbon nanotubes generate a surface functional group at the surface or the end of the carbon nanotube. Functional groups such as carboxyl group, carbonyl group, and hydroxyl group are generated. When the treatment is performed in a liquid phase, a carboxyl group and a hydroxyl group are generated, and when the treatment is performed in a gas phase, a carbonyl group is generated.

The concentration of the surfactant in the liquid comprising heavy water or water and a nonionic surfactant mentioned above is preferably from the critical micelle concentration to 10% by mass, and more preferably from the critical micelle concentration to 3% by mass. The concentration less than the critical micelle concentration is not preferred because dispersion is impossible. When the concentration is 10% by mass or less, a sufficient density of carbon nanotubes can be applied after separation, while reducing the amount of surfactant. As used herein, the critical micelle concentration (CMC) refers to the concentration serving as an inflection point of the surface tension measured by, for example, changing the concentration of an aqueous surfactant solution using a surface tensiometer such as a Wilhelmy surface tensiometer at a constant temperature. As used herein, the "critical micelle concentration" is a value under atmospheric pressure at 25° C.

The concentration of the carbon nanotubes in the above cutting and dispersion step (the weight of the carbon nanotubes/(the total weight of the carbon nanotubes, the dispersion medium and the surfactant)×100) is not particularly limited, and for example, may be 0.0003 to 10% by mass, preferably 0.001 to 3% by mass, and more preferably 0.003 to 0.3% by mass.

The dispersion liquid obtained through the above cutting and dispersion step may be used as it is in the separation step described below, or a step of concentration, dilution, or the like may be performed before the separation step.

Separation of the semiconducting carbon nanotubes and the metallic carbon nanotubes can be performed by, for example, the electric-field-induced layer formation method (ELF method: see, for example, K. Ihara et al. J. Phys. Chem. C. 2011, 115, 22827 to 22832 and Japanese Patent No. 5717233, which are incorporated herein by reference). One example of the separation method using the ELF method will be described. Carbon nanotubes, preferably single-walled carbon nanotubes are dispersed by a nonionic surfactant, and the dispersion liquid is put into a vertical separation apparatus, and then a voltage is applied to the electrodes arranged above and below, so that the carbon nanotubes are separated by free flow electrophoresis. The mechanism of separation can be inferred as follows for example. When the carbon nanotubes are dispersed by the nonionic surfactant, the micelle of the semiconducting carbon nanotubes has a negative zeta potential, whereas the micelle of the metallic carbon nanotubes has an opposite (positive) zeta potential (in recent years, it is considered that the metallic carbon nanotubes have a slightly negative zeta potential or are barely charged). Thus, when an electric field is applied to the carbon nanotube dispersion liquid, the micelle of the semiconducting carbon nanotubes is electrophoresed toward the anode (+) direction, and the micelle of the metallic carbon nanotubes is electrophoresed toward the cathode (−) direction by the difference between the zeta potentials, and the like. Eventually, the layer in which the semiconducting carbon nanotubes are concentrated is formed near the anode, and the layer in which the metallic carbon nanotubes are concentrated is formed near the cathode in the separation tank. The voltage for separation may be appropriately set in consideration of the composition of the dispersion medium, the charge amount of carbon nanotubes, and the like, and is preferably 1 V or more and 200 V or less, and more preferably 10 V or more and 200 V or less. It is preferably 100 V or more from the viewpoint of shortening the time for the separation step. It is preferably 200 V or less from the viewpoint of suppressing the generation of bubbles during separation and maintaining the separation efficiency. The purity is improved by repeating separation. The same separation procedure may be performed by resetting the dispersion liquid after separation to the initial concentration. As a result, the purity can be further increased.

Through the aforementioned dispersion and cutting step and separation step of the carbon nanotubes, a dispersion liquid in which the semiconducting carbon nanotubes having the desired diameter and length are concentrated can be obtained. As used herein, the carbon nanotube dispersion liquid in which semiconducting carbon nanotubes are concentrated may be referred to as the "semiconducting carbon nanotube dispersion liquid". The semiconducting carbon nanotube dispersion liquid obtained by the separation step comprises semiconducting carbon nanotubes generally 67% by mass or more, preferably 70% by mass or more, more preferably 80% by mass or more in the total amount of carbon nanotubes, and it is particularly preferably 90% by mass or more, more preferably 95% by mass or more, further preferably 99% by mass or more (the upper limit may be 100% by mass). The separation tendency of the metallic and semiconducting carbon nanotubes can be analyzed by microscopic Raman spectroscopy and ultraviolet-visible near-infrared absorptiometry.

The dispersion liquid after the above cutting and dispersion step, and before the separation step may be subjected to centrifugation treatment to remove the bundles, amorphous carbon, metal impurities, and the like in the carbon nanotube dispersion liquid. The centrifugal acceleration may be appropriately adjusted, and is preferably 10000×g to 500000×g, more preferably 50000×g to 300000×g, and optionally 100000×g to 300000×g. The centrifugation time is preferably 0.5 hours to 12 hours, and more preferably 1 to 3 hours. The centrifugation temperature may be appropriately adjusted, and is preferably 4° C. to room temperature, and more preferably 10° C. to room temperature.

The concentration of the surfactant in the carbon nanotube dispersion liquid after separation which is used for the application may be appropriately controlled. The concentration of the surfactant in the carbon nanotube dispersion liquid is preferably from the critical micelle concentration to about 5% by mass, more preferably, 0.001% by mass to 3% by mass, and particularly preferably 0.01 to 1% by mass to suppress the reaggregation after application and the like.

The semiconducting carbon nanotube dispersion liquid obtained by the process described above can be applied on the insulating layer or on a predetermined base material, dried, and, optionally heat treated to form a bolometer film.

The method for applying the semiconducting carbon nanotube dispersion liquid to the heat insulating layer or a predetermined base material is not particularly limited, and examples thereof include dropping method, spin coating, printing, inkjet, spray coating, dip coating, and the like. From the viewpoint of reducing the manufacturing cost, a printing method is preferred. The printing methods can include application (dispenser, inkjet or the like), transferring (microcontact print, gravure printing, or the like) and the like.

The semiconducting carbon nanotubes dispersion liquid applied on the heat insulating layer or a desired based material may be subjected to a heat treatment to remove the surfactant and the solvent. The temperature of the heat treatment may be appropriately set as long as it is equal to or higher than the decomposition temperature of the surfactant, and it is preferably 150 to 500° C., and more preferably 200 to 500° C., for example 200 to 400° C. A temperature of 200° C. or more is preferred because the remaining of the decomposition product of the surfactant can be easily suppressed. A temperature of 500° C. or less, for example 400° C. or less is preferred because the change in the quality of the substrate or other components can be suppressed. Also, the decomposition of carbon nanotubes, the change in size, the leaving of functional groups, and the like can be suppressed.

(Negative Thermal Expansion Material)

In an embodiment, the bolometer films can comprise a negative thermal expansion material in addition to the carbon nanotubes.

The bolometer film according to the present embodiment is a carbon nanotube composite material in which a negative thermal expansion material is dispersed in a carbon nanotube aggregate having a three-dimensional mesh structure that forms a network structure formed of dispersed carbon nanotubes intertwined with each other into an aggregate. In such a three-dimensional electrically conductive network formed of carbon nanotubes, the carbon nanotubes are not necessarily all connected to each other to contribute to electric conductivity in the bolometer material, but part of the carbon nanotubes does not contribute to the electrical conduction mechanism. These unconnected carbon nanotubes build a new electrically conductive path resulting from the effect of reduction in the volume of the negative thermal expansion material exhibited by an increase in temperature. Or, the effect of reduction in the volume further increases the contact area between the carbon nanotubes, and moreover, the number of electrically conductive paths also increases. As a result, a larger increase in current occurs as the temperature increases, resulting in an improvement in a TCR value. That is, the negative thermal expansion material mixed with the semiconducting carbon nanotubes shrinks as the temperature rises, creating an additional network of carbon nanotubes previously separate from each other, resulting in an increase in the number of electrically conductive paths, whereby a greater amount of current flows. Furthermore, in an embodiment, using a negative thermal expansion material having resistance greater than that of the semiconducting carbon nanotubes allows more efficient formation of electrically conductive paths formed of the semiconducting carbon nanotubes.

In the present specification, the negative thermal expansion material means a material that has a negative coefficient of expansion and contracts as the temperature rises. Examples of the negative thermal expansion material include a material having a coefficient of linear thermal expansion $\Delta L/L$ ((length after expansion−length before expansion)/length before expansion) per temperature difference of 1K preferably ranging from $-1\times10^{-6}$/K to $-1\times10^{-3}$/K, more preferably from $-1\times10^{-5}$/K to $-1\times10^{-3}$/K, in any temperature range from −100 to +200° C., for example, the range from −100 to +100° C., preferably in the temperature range over which the bolometer is used, for example, at least in the range from −50 to 100° C.

The coefficient of thermal expansion can be measured in accordance, for example, with JIS Z 2285 (method for measuring coefficient of linear expansion of metallic materials) or JIS R 1618 (method for measuring thermal expansion of fine ceramics based on thermo-mechanical analysis).

In an embodiment, the negative thermal expansion material is preferably a material that exhibits sufficient negative thermal expansion in the environment in which the bolometer is used. The temperatures of the environment in which the bolometer is used range, for example, from −350° C. to 100° C., preferably from −40° C. to 80° C., more preferably in some cases from 20° C. to 30° C., for example, from 21° C. to 30° C.

The humidity in the environment in which the bolometer is used, for example, in a case where the bolometer is used in a structure in which the bolometer part is exposed to the atmosphere, may be the ambient humidity, preferably, for example, 75% RH or lower. When the bolometer is vacuum-packaged or used in a structure in which the package is filled with an inert gas, the humidity is preferably, for example, 5% RH or lower, and may not fall within the range described above depending on the degree of vacuum and other factors. From the viewpoint of long-term stability of the device, lower humidity is preferable, so that the lower limit is not limited to a specific value in either case, and the humidity is 0% RH or higher, for example, higher than 0% RH.

The resistivity of the negative thermal expansion material described above is not limited to a specific value, and can range from $10^{-1}$ Ωcm, for example, from 10 Ωcm to $10^8$ Ωcm, preferably from $10^2$ Ωcm to $10^7$ Ωcm, in any temperature range from −100 to +100° C., preferably at the temperature at which the bolometer is used, for example, room temperature (about 23° C.). The resistivity can be measured in accordance with standard methods, for example, JIS K 7194 and JIS K 6911.

In the present specification, the negative thermal expansion material may include oxides, nitrides, sulphides or multi-element compounds containing one or two or more of Li, Al, Fe, Ni, Co, Mn, Bi, La, Cu, Sn, Zn, V, Zr, Pb, Sm, Y, W, Si, P, Ru, Ti, Ge, Ca, Ga, Cr, Cd, but not limited thereto. A mixture of two or more compounds may be used.

The negative thermal expansion material may include, but not limited thereto, vanadium oxides, β-eucryptite, bismuth-nickel oxides, zirconium tungstate, ruthenium oxides, manganese nitrides, lead titanate, samarium monosulphide and others (including those in which one or more of the elements of these compounds have been replaced by the above elements). For example, $LiAlSiO_4$, $ZrW_2O_8$, $Zr_2WO_4(PO_4)_2$, $BiNi_{0.85}Fe_{0.15}O_3$, $Bi_{0.95}La_{0.05}NiO_3$, $Pb_{0.76}La_{0.04}Bi_{0.20}VO_3$, $Sm_{0.78}Y_{0.22}S$, $Cu_{1.8}Zn_{0.2}V_2O_7$, $Cu_2V_2O_7$, $0.4PbTiO_3\text{-}0.6BiFeO_3$, $MnCo_{0.98}Cr_{0.02}Ge$, $Ca_2RuO_{3.74}$, $Mn_3Ga_{0.7}Ge_{0.3}N_{0.88}C_{0.12}$, $Cd(CN)_2 \cdot xCCl_4$, $LaFe_{10.5}Co_{1.0}Si_{1.5}$, $Ca_2RuO_4$, $Mn_{3.27}Zn_{0.45}Sn_{0.28}N$, $Mn_3Ga_{0.9}Sn_{0.1}N_{0.9}$, $Mn_3ZnN$ are suitable.

In one embodiment, among the negative thermal expansion materials, oxides, nitrides, and sulphides are preferable from the view point of ease of synthesis and availability.

In the present specification, the size of the negative thermal expansion material can be selected as appropriate. Preferably, it is between 10 nm and 100 μm, more preferably 15 nm to 10 μm, and in some cases, it is also preferred to be between 50 nm and 5 μm.

The form of the negative thermal expansion material is not particularly limited, but may be, for example, spherical, needle, rod, plate, fibre, scale and the like, with spherical being preferred in terms of film formability.

The amount of negative thermal expansion material in the bolometer film can be selected as appropriate, but it is preferable that it is contained in an amount of 1 to 99% by mass, based on the total mass of the bolometer film, with 1 to 70% by mass being more preferable, for example, 1 to 50% by mass, in some cases 10 to 50% by mass, and optionally 40% by mass or less may also be preferred.

In addition to the carbon nanotubes and the negative thermal expansion material, the bolometer film may also comprise a binding agent and, if desired, other components, but it is preferred that the total mass of the carbon nanotubes and the negative thermal expansion material is 70% by mass or more, more preferably 90% by mass or more, and even more preferably 95% by mass or more, based on the mass of the bolometer film.

The bolometer film comprising carbon nanotubes and negative thermal expansion materials can be produced by using a dispersion in which a carbon nanotube dispersion is added with the negative thermal expansion materials and, if necessary, binding agents and the like in the above-described method of producing a bolometer film using a carbon nanotube dispersion.

In addition to the components described above, the bolometer-type detector according to the present embodiment can be further provided with any components that a bolometer can include.

<Light Reflection Layer>

The bolometer-type detector of the present embodiment may comprise a light reflection layer in order to improve the absorption rate of the electromagnetic wave to be detected.

The light reflection layer can be equipped between the bolometer film 105 and the substrate 101, for example, between the heat insulating layers 102. It is preferable that the light reflection layer is set at the position where the distance between the bolometer film 105 and the light reflection layer is $d=\lambda/4$ in consideration of the wavelength $\lambda$, of the electromagnetic wave to be detected.

For the light reflection layer, any materials that can be used in a bolometer can be used without limitation, and such materials generally include metals such as gold, silver, aluminium and the like, and the light reflection layer can be formed by vapor deposition, sputtering, plating and the like.

<Light Absorbing Material Layer>

The bolometer-type detector of the present embodiment may comprise a light absorbing material layer in order to improve the absorption rate of the electromagnetic wave to be detected.

The light absorbing material layer may be set on the side from which the electromagnetic wave to be detected is incident, for example, on the above side of the bolometer film 105 or the protective layer 107.

The thickness of the light absorbing material layer can be set as appropriate in considering the material, and may be for example between 50 nm to 1 μm.

For the light absorbing material layer, any materials that can be used in a bolometer can be used without limitation, and the materials may include a coating film of polyimide, a thin film of titanium nitride and the like.

In addition to the above, in the bolometer-type detector and the method for manufacturing the same according to the present embodiment, the configuration and the method for manufacturing the same used in a bolometer-type detector, especially in a printed-type bolometer-type detector can be applied without particular restriction, except that part of the heat insulating layers is removed and the wiring for signal output is disposed in a layer different from the bolometer films.

For example, simple matrix-type bolometer-type detectors are described above, but the bolometer-type detector of the present embodiment may also be an active matrix-type array, such as a thin-film transistor (TFT) array.

While the invention has been described with reference to example embodiments, the invention is not limited to these embodiments. Various changes that can be understood by those of ordinary skill in the art may be made to form and details of the present invention without departing from the spirit and scope of the present invention.

The whole or part of the example embodiments disclosed above can be described as, but not limited to, the following supplementary notes.

[Supplementary Note 1]

A bolometer-type detector comprising a plurality of pixels, the bolometer-type detector at least comprising a substrate, a heat insulating layer provided on the substrate, bolometer films provided on individual pixels on the heat insulating layer, and a wiring for signal output connected to contact electrodes provided in contact with the bolometer films, wherein the wiring for signal output is disposed in a layer different from the bolometer films, and the heat insulating layer between adjacent pixels is removed at least partially in the depth direction and in a region of a length of 50% or longer and a width of 100 nm or wider of a closed curve that surrounds each bolometer film.

[Supplementary Note 2]

The detector according to Supplementary note 1, wherein the heat insulating layer is a parylene layer.

[Supplementary Note 3]

The detector according to Supplementary note 1 or 2, wherein the bolometer film comprises an organic material.

[Supplementary Note 4]

The detector according to any one of Supplementary notes 1 to 3, wherein the bolometer film comprises semiconducting carbon nanotubes.

[Supplementary Note 5]

The detector according to any one of Supplementary notes 1 to 4, wherein the bolometer film comprises semiconducting carbon nanotubes and a negative thermal expansion material.

[Supplementary Note 6]

The detector according to any one of Supplementary notes 1 to 5, further comprising a light absorbing material layer on the upper side of the bolometer film.

[Supplementary Note 7]

The detector according to any one of Supplementary notes 1 to 6, wherein metal is exposed at the surface of the region where the heat insulating layer is removed.

[Supplementary Note 8]

The detector according to Supplementary note 7, wherein the exposed metal also serves as a wiring for signal output.

[Supplementary Note 9]

A method for manufacturing a bolometer-type detector comprising a plurality of pixels, the method comprising forming a first heat insulating layer on a substrate, forming one kind of wiring for signal output on the first heat insulating layer, forming a second heat insulating layer on the first heat insulating layer on which the wiring for signal output has been formed, forming the other kind of wiring for signal output on the second heat insulating layer, forming a third heat insulating layer on the second heat insulating layer on which the wiring for signal output has been formed, forming bolometer films on the third heat insulating layer, forming contact electrodes on the bolometer films, optionally forming a protective layer on the bolometer films on which the contact electrodes have been formed, removing the heat insulating layer between adjacent pixels at least partially in the depth direction and in a region of a length of 50% or longer and a width of 100 nm or wider of a closed curve that surrounds each bolometer film, and connecting the contact electrodes to each of the wirings for signal output.

[Supplementary Note 10]

The manufacturing method according to Supplementary note 9, comprising forming a first heat insulating layer on a substrate, forming one kind of wiring for signal output on the first heat insulating layer, forming a second heat insulating layer on the first heat insulating layer on which the wiring for signal output has been formed, forming the other kind of wiring for signal output on the second heat insulating layer, forming a third heat insulating layer on the second heat insulating layer on which the wiring for signal output has been formed, forming a bolometer film layer on the third heat insulating layer, forming contact electrodes on individual pixels on the bolometer film layer, forming a protective layer on the bolometer film layer on which the contact electrodes have been formed, forming an etching mask on the protective layer so as to cover each of the regions to be a bolometer film of each of the pixels, etching away the heat insulating layer between adjacent pixels at least partially in the depth direction and in the region of the length of 50% or longer and the width of 100 nm or wider of the closed curve that surrounds each bolometer film, removing the etching mask, and connecting the contact electrodes to each of the wirings for signal output.

[Supplementary Note 11]

The manufacturing method according to Supplementary note 10, comprising etching away the heat insulating layer between adjacent pixels to the depth of the wiring for signal output.

EXPLANATION OF REFERENCE

101 Substrate
102 Heat insulating layer
102-1 First heat insulating layer
102-2 Second heat insulating layer
102-3 Third heat insulating layer
103 Wiring for signal output (vertical wiring)
104 Wiring for signal output (horizontal wiring)
105 Bolometer film
106 Contact electrode
107 Protective layer
108 Etching mask
109 Connection electrode
1 Base substrate
3 Temperature detection part
4 Heat insulating unit
6 Infrared reflection film
7 Gap
42 Leg
701 Thermistor resistor
702 First electrode
703 Second electrode
704 Column wiring
705 Row wiring
706 Insulating film
710 Substrate
711 Heat insulating layer
712 Light reflection film
713 Light transmitting layer

What is claimed is:

1. A bolometer-type detector comprising a plurality of pixels, the bolometer-type detector at least comprising
a substrate,
a heat insulating layer provided on the substrate,
bolometer films provided on individual pixels on the heat insulating layer, and
a wiring for signal output connected to contact electrodes provided in contact with the bolometer films,
wherein the wiring for signal output is disposed in a layer different from the bolometer films, and
the heat insulating layer between adjacent pixels is removed at least partially in the depth direction and in a region of a length of 50% or longer and a width of 100 nm or wider of a closed curve that surrounds each bolometer film.

2. The detector according to claim 1, wherein the heat insulating layer is a parylene layer.

3. The detector according to claim 1, wherein the bolometer film comprises an organic material.

4. The detector according to any one of claim 1, wherein the bolometer film comprises semiconducting carbon nanotubes.

5. The detector according to any one of claim 1, wherein the bolometer film comprises semiconducting carbon nanotubes and a negative thermal expansion material.

6. The detector according to any one of claim 1, further comprising a light absorbing material layer on the upper side of the bolometer film.

7. The detector according to any one of claim 1, wherein metal is exposed at the surface of the region where the heat insulating layer is removed.

8. The detector according to claim 7, wherein the exposed metal also serves as a wiring for signal output.

9. A method for manufacturing a bolometer-type detector comprising a plurality of pixels, the method comprising
forming a first heat insulating layer on a substrate,
forming one kind of wiring for signal output on the first heat insulating layer,
forming a second heat insulating layer on the first heat insulating layer on which the wiring for signal output has been formed,
forming the other kind of wiring for signal output on the second heat insulating layer,
forming a third heat insulating layer on the second heat insulating layer on which the wiring for signal output has been formed,
forming bolometer films on the third heat insulating layer,
forming contact electrodes on the bolometer films,
optionally forming a protective layer on the bolometer films on which the contact electrodes have been formed,
removing the heat insulating layer between adjacent pixels at least partially in the depth direction and in a region of a length of 50% or longer and a width of 100 nm or wider of a closed curve that surrounds each bolometer film, and
connecting the contact electrodes to each of the wirings for signal output.

10. The manufacturing method according to claim 9, comprising
forming a first heat insulating layer on a substrate,
forming one kind of wiring for signal output on the first heat insulating layer, forming a second heat insulating layer on the first heat insulating layer on which the wiring for signal output has been formed, forming the other kind of wiring for signal output on the second heat insulating layer, forming a third heat insulating layer on the second heat insulating layer on which the wiring for signal output has been formed, forming a bolometer film layer on the third heat insulating layer, forming contact electrodes on individual pixels on the bolometer film layer, forming a protective layer on the bolometer film layer on which the contact electrodes have been formed, forming an etching mask on the protective layer so as to cover each of the regions to be a bolometer film of each of the pixels, etching away the heat insulating layer between adjacent pixels at least partially in the depth direction and in the region of the length of 50% or longer and the width of 100 nm or wider of the closed curve that surrounds each bolometer film, removing the etching mask, and connecting the contact electrodes to each of the wirings for signal output.

* * * * *